(12) United States Patent
Nasrullah et al.

(10) Patent No.: US 9,842,784 B2
(45) Date of Patent: Dec. 12, 2017

(54) SYSTEM AND METHODS FOR PRODUCING MODULAR STACKED INTEGRATED CIRCUITS

(71) Applicant: zGlue, Inc., Mountain View, CA (US)

(72) Inventors: Jawad Nasrullah, Palo Alto, CA (US); Ming Zhang, Foster City, CA (US)

(73) Assignee: ZGLUE, INC., Foster City, CA (US)

( * ) Notice: Subject to any disclaimer, the term of this patent is extended or adjusted under 35 U.S.C. 154(b) by 0 days.

(21) Appl. No.: 15/309,163

(22) PCT Filed: Jun. 23, 2015

(86) PCT No.: PCT/US2015/037233
§ 371 (c)(1),
(2) Date: Nov. 4, 2016

(87) PCT Pub. No.: WO2015/200351
PCT Pub. Date: Dec. 30, 2015

(65) Prior Publication Data
US 2017/0062294 A1    Mar. 2, 2017

Related U.S. Application Data

(60) Provisional application No. 62/015,530, filed on Jun. 23, 2014, provisional application No. 62/058,372, filed on Oct. 1, 2014.

(51) Int. Cl.
*H01L 21/66* (2006.01)
*G06F 17/50* (2006.01)
(Continued)

(52) U.S. Cl.
CPC .......... *H01L 22/34* (2013.01); *G06F 17/5077* (2013.01); *H01L 22/14* (2013.01);
(Continued)

(58) Field of Classification Search
CPC ......... H01L 22/34; H01L 22/14; H01L 24/16; H01L 24/48; H01L 24/73; H01L 24/81;
(Continued)

(56) References Cited

U.S. PATENT DOCUMENTS

| 6,425,101 B1 | 7/2002 | Garreau |
| 2008/0143379 A1 | 6/2008 | Norman |

(Continued)

FOREIGN PATENT DOCUMENTS

WO    2013004836 A1    1/2013

OTHER PUBLICATIONS

International Search Report and Written Opinion received for PCT/US2015/037233 dated Sep. 30, 2015., 12 pgs.

*Primary Examiner* — Cuong Q Nguyen
*Assistant Examiner* — Tong-Ho Kim
(74) *Attorney, Agent, or Firm* — Dorsey & Whitney LLP

(57) ABSTRACT

A system according to some examples herein includes a base chip which may include a plurality of attachment slots for attaching dies thereto. One or more of the attachment slots may be programmable attachment slots. The base chip may further include circuitry for interconnecting the dies attached to the base chip. For example, the base chip may include a plurality of cross bar switches, each of which is associated with respective ones of the plurality of attachment slots. The base chip may further include a configuration block, which is adapted to receive and transmit test signals for determining electrically connected signal lines of one or more attachment slots when one or more dies are attached to the base chip and which is further adapted to receive configuration data for programming signal (including power and ground) channels of the cross bar switches.

27 Claims, 21 Drawing Sheets

(51) Int. Cl.
*H01L 25/065* (2006.01)
*H01L 25/18* (2006.01)
*H01L 25/00* (2006.01)
*H01L 23/00* (2006.01)

(52) U.S. Cl.
CPC .............. *H01L 24/16* (2013.01); *H01L 24/81* (2013.01); *H01L 25/0652* (2013.01); *H01L 25/18* (2013.01); *H01L 25/50* (2013.01); *H01L 24/48* (2013.01); *H01L 24/73* (2013.01); *H01L 2224/16145* (2013.01); *H01L 2224/16227* (2013.01); *H01L 2224/48091* (2013.01); *H01L 2224/48227* (2013.01); *H01L 2224/73207* (2013.01); *H01L 2224/81136* (2013.01); *H01L 2224/81193* (2013.01); *H01L 2224/81908* (2013.01); *H01L 2225/0651* (2013.01); *H01L 2225/06513* (2013.01); *H01L 2225/06517* (2013.01); *H01L 2225/06593* (2013.01); *H01L 2225/06596* (2013.01); *H01L 2924/00014* (2013.01); *H01L 2924/1531* (2013.01); *H01L 2924/15153* (2013.01); *H01L 2924/15311* (2013.01); *H01L 2924/19041* (2013.01); *H01L 2924/19042* (2013.01); *H01L 2924/19104* (2013.01)

(58) Field of Classification Search
CPC ..... H01L 25/0652; H01L 25/18; H01L 25/50; H01L 2224/16145; H01L 2224/16227; H01L 2224/48091; H01L 2224/48227; H01L 2224/73207; H01L 2224/81136; H01L 2224/81193; H01L 2224/81908; H01L 2225/0651; H01L 2225/06513; H01L 2225/06517; H01L 2225/06593; H01L 2225/06596; H01L 2924/0001; G06F 17/5077
USPC .................................................. 257/48; 438/14
See application file for complete search history.

(56) References Cited

U.S. PATENT DOCUMENTS

2011/0148456 A1* 6/2011 Mooyman-Beck ................. G01R 31/318511
  324/762.02
2013/0271167 A1* 10/2013 Thiruvengadam . G01R 31/2607
  324/750.02
2014/0091819 A1* 4/2014 Gong ................ G01R 31/31926
  324/750.3

\* cited by examiner

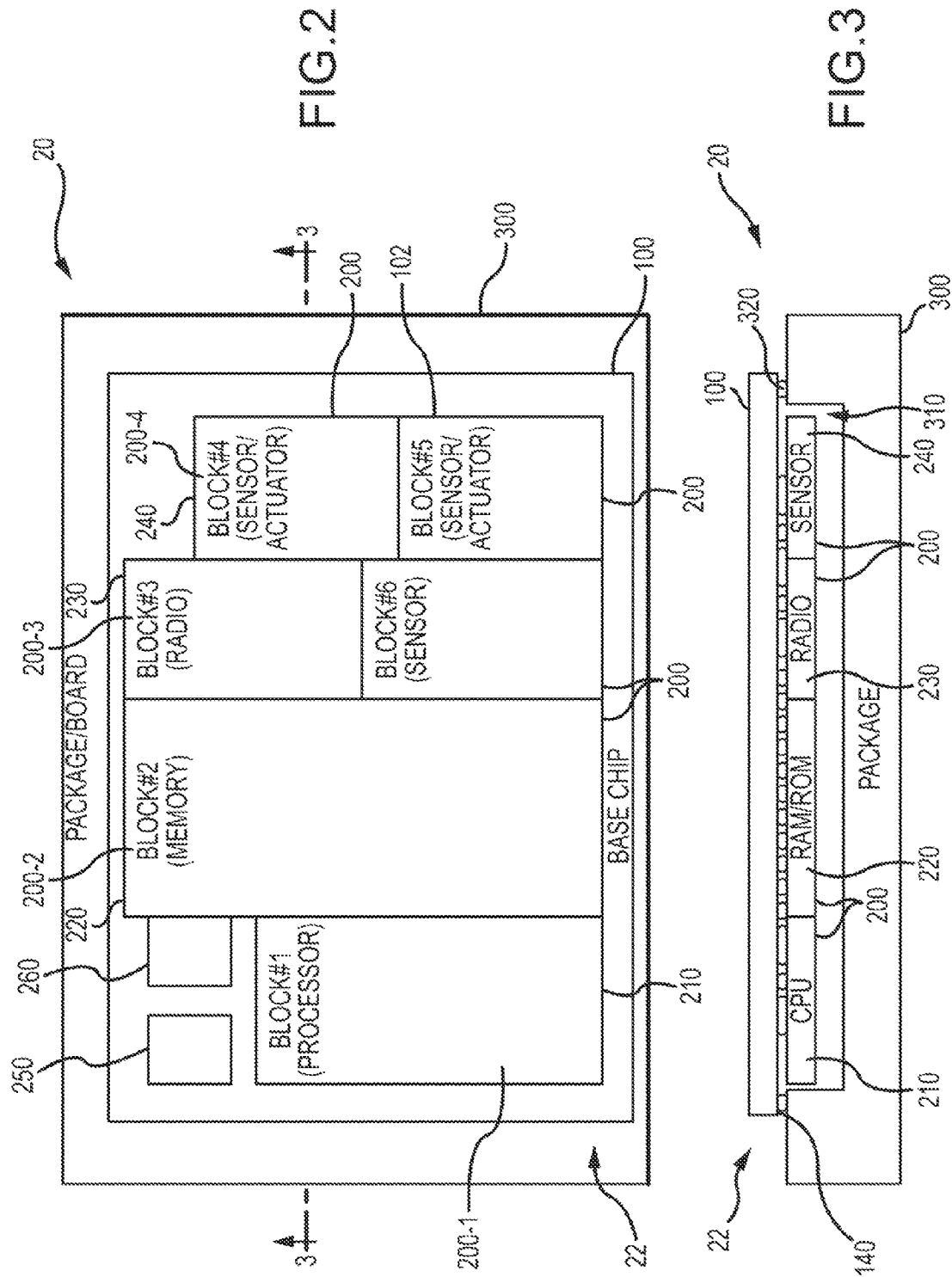

SYSTEM AND METHODS FOR PRODUCING MODULAR STACKED INTEGRATED CIRCUITS

CROSS-REFERENCE TO RELATED APPLICATION(S)

This application claims priority to U.S. Provisional Application No. 62/015,530 filed Jun. 23, 2014 and U.S. Provisional Application No. 62/058,372 filed Oct. 1, 2014, which provisional applications are herein incorporated by reference, in their entirety, for any purpose.

TECHNICAL FIELD

The present disclosure relates to the field of integrated circuits and, in particular, to systems and methods for providing modular stacked integrated circuits, e.g., for use as embedded computing systems.

BACKGROUND

The design of electronic systems requires usage of electronic components manufactured by specialized fabrication processes. Electronic systems are typically built on printed circuit boards by connecting together a number of electronic components. For applications requiring extreme miniaturization and ultra-low power operation, systems built with a printed circuit board and discrete components result in bulky and energy inefficient designs. Especially for the 'Internet of Things' application, circuits need to operate with a small battery, such as a button cell, for an extended period of time. The state-of-the-art devices designed for embedded and Internet of Things with currently existing technology tend to sacrifice performance and functionality to achieve longer battery life. Otherwise, miniaturization and power reduction in current technology can be achieved by integrating circuits on a monolithic piece of semiconductor, which comes at the cost of nanometer-scale engineering, expensive design tools, and long development cycle and manufacturing turnaround time. As such, improved methods and systems for providing modular stacked integrated circuits having small form factors and low power consumption may be needed.

SUMMARY

Systems and methods for producing embedded computing systems comprising modular stacked integrated circuits are described. A system according to some examples herein includes a base chip which may include a plurality of attachment slots for attaching dies thereto. One or more of the attachment slots may be programmable attachment slots. The base chip may further include circuitry for interconnecting the dies attached to the base chip. For example, the base chip may include a plurality of cross bar switches, each of which is associated with respective ones of the plurality of attachment slots. The base chip may further include a configuration block, which is adapted to receive and transmit test signals for determining electrically connected signal lines of one or more attachment slots when one or more dies are attached to the base chip and which is further adapted to receive configuration data for programming signal (including power and ground) channels of the cross bar switches.

In some examples according to the present disclosure, a system can include a base chip with a plurality of attachment slots. The system further includes a plurality of dies (also referred to as modular blocks, components, modular components, or chiplets) attached to the base chip at respective ones of the plurality of attachment slots. One or more of the attachment slots of the base chip may be programmable. The base chip may further include circuitry for interconnecting the dies attached to the base chip. For example, the base chip may include a plurality of cross bar switches, each of which is associated with respective ones of the plurality of attachment slots. The base chip further includes a test and configuration block, which is adapted to receive and transmit test signals for determining properties of pins of one or more attachment slots when one or more dies are attached to the base chip and which is further adapted to receive configuration data for programming signal channels of the cross bar switches.

Methods of producing modular integrated circuits may include coupling a first die to a first attachment slot of a base chip and a second die to a second attachment slot of the base chip, the base chip comprising first and second programmable crossbar switches coupled to respective ones of the first and second attachment slots, determining connectivity between a first array of metal contacts of the base chip and first die contacts and between a second array of metal contacts of the base chip and second die contacts to generate alignment data, receiving, in respective memory elements of the first and second programmable cross bar switches, configuration data for the first and second programmable cross bar switches, and programming signal channels of the first and second programmable crossbar switches based on the received configuration data and generated alignment data.

BRIEF DESCRIPTION OF THE DRAWINGS

FIG. 3 is a simplified cross section view of the system in FIG. 2 taken along line 3-3 in FIG. 2.

DETAILED DESCRIPTION

Certain details are set forth below to provide a sufficient understanding of embodiments depicted in the accompanying drawings. Some embodiments, however, may not include all details described. It will be clear to one having skill in the art that embodiments of the present disclosure may be practiced without these particular details. In some instances, well known structures may not be shown in order to avoid unnecessarily obscuring described embodiments of the disclosure. Moreover, the particular embodiments described herein are provided by way of example and should not be used to limit the scope of the invention to these particular embodiments.

Figure 1:
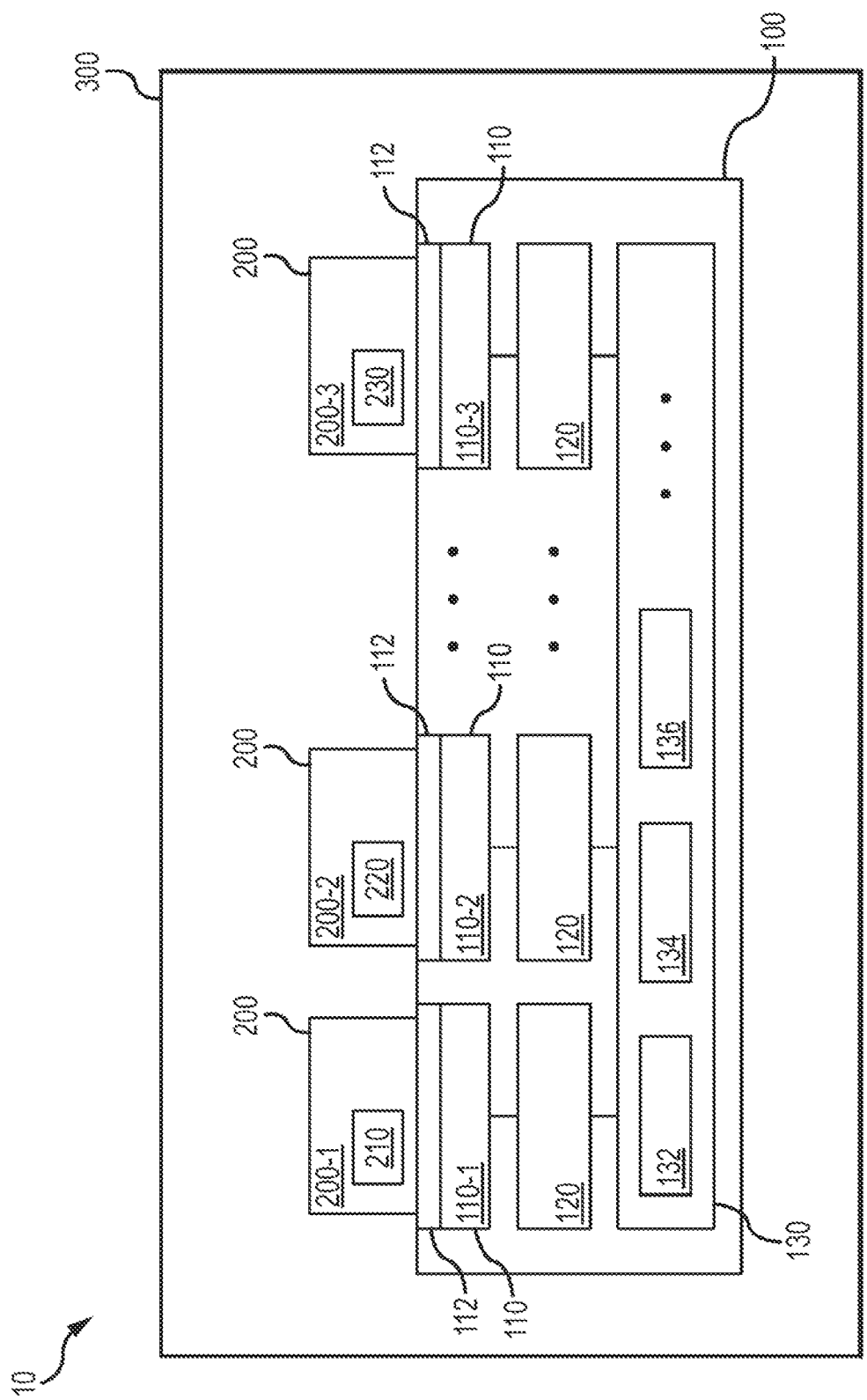
FIG. 1 is a block diagram of a system including a base chip according to examples of the present disclosure.

Referring now to FIGS. 1-6, systems including a base chip according to examples of the present disclosure will be described. FIG. 1 shows a block diagram of system 10. System 10 includes a base chip 100 made from a semiconductor material. Base chip 100 includes a plurality of attachment slots 110 and a plurality of configurable connection boxes 120 associated with respective ones of the plurality of attachment slots 110. Base chip 100 also includes one or more functional blocks embedded in the base chip or attached in the form as chiplets 130 comprising circuitry 132, 134, 136 (interchangeably referred to herein as blocks or modules) configured to provide functionality that may be common to different types of applications. For example, base chip 100 may include blocks which provide functionality such as power management (e.g., block 132), input/output (e.g., block 134), voltage regulation, clocks, security, and interconnects. Base chip 100 may include one or more test and configuration blocks (e.g., block 136) which may be configured for testing and alignment of connections between base chip 100 and dies attached thereto. Test and configuration blocks according to the present disclosure may also provide functionality for programming configurable connection boxes (e.g., boxes 120) as will be further described. Base chip 100 may be coupled to a package 300.

As described, base chip 100 includes a plurality of attachment slots 110 for coupling dies 200 (also referred to herein as components 200 or modular components 200) thereto. Base chip 100 may include any number of attachment slots for coupling any number of dies thereto. Individual dies may comprise circuitry (e.g., blocks 210, 220, 230) for performing virtually any desired functionality. Attachment slot 110 refers to a region 11 (see e.g., FIG. 4) on a contact side 140 of base chip 100. Individual attachment slots comprise a plurality of metal contacts 112 for forming electrical connections with components 200 that may be attached to base chip 100. The metal contacts 112 of base chip 100 may have any geometry such as pillars, pads, bumps or micro bumps and may be made of a conductive material such as metal. In example, the metal contacts 112 of base chip 100 may comprise metal surface bumps or micro-bumps, metal pillars, metal pads, or any other means of making metal to metal contact. Surface bumps and bumps may be interchangeably used herein.

Similarly, individual components 200 comprise a contact side 204 and include metal contacts 202 (e.g., surface bumps), which may vary in size, shape, or arrangement from the size, shape, or arrangement of metal contacts 112 of base chip 100. The metal contacts 112 of base chip 100 may, but need not be, uniformly spaced apart.

One or more of the attachment slots 110 may be programmable such that they can accommodate any of a variety of dies comprising virtually any type of circuitry and having different input/output channels (also referred to herein as signal channels of signal lines) and routing needs. In this manner, stacked integrated circuits may be produced using a base chip according to the present disclosure and stacking different dies configured to provide different functionality as may be desired. As will be further described, a circuit schematic may be loaded onto base chip 100 and attachment slots 110 may be programmed to provide input/output channels based on the schematic. The number, size and/or pitch of the metal contacts 112 associated with a given attachment slot 110 need not correspond with the number, size and or pitch of the metal contacts 202 of a particular die 200. The ability to attach dies with metal contacts which differ from the metal contacts of the base chip may enable modularity as well as reduce the complexity and cost of manufacturing and assembly of embedded computing systems according to the present disclosure. Misalignment between individual metal contacts that may result from differences in size, shape, and arrangement of metal contacts on the base chip and dies, may be resolved by test and configuration block(s) (e.g., block 136) according to the present disclosure.

Figure 4:
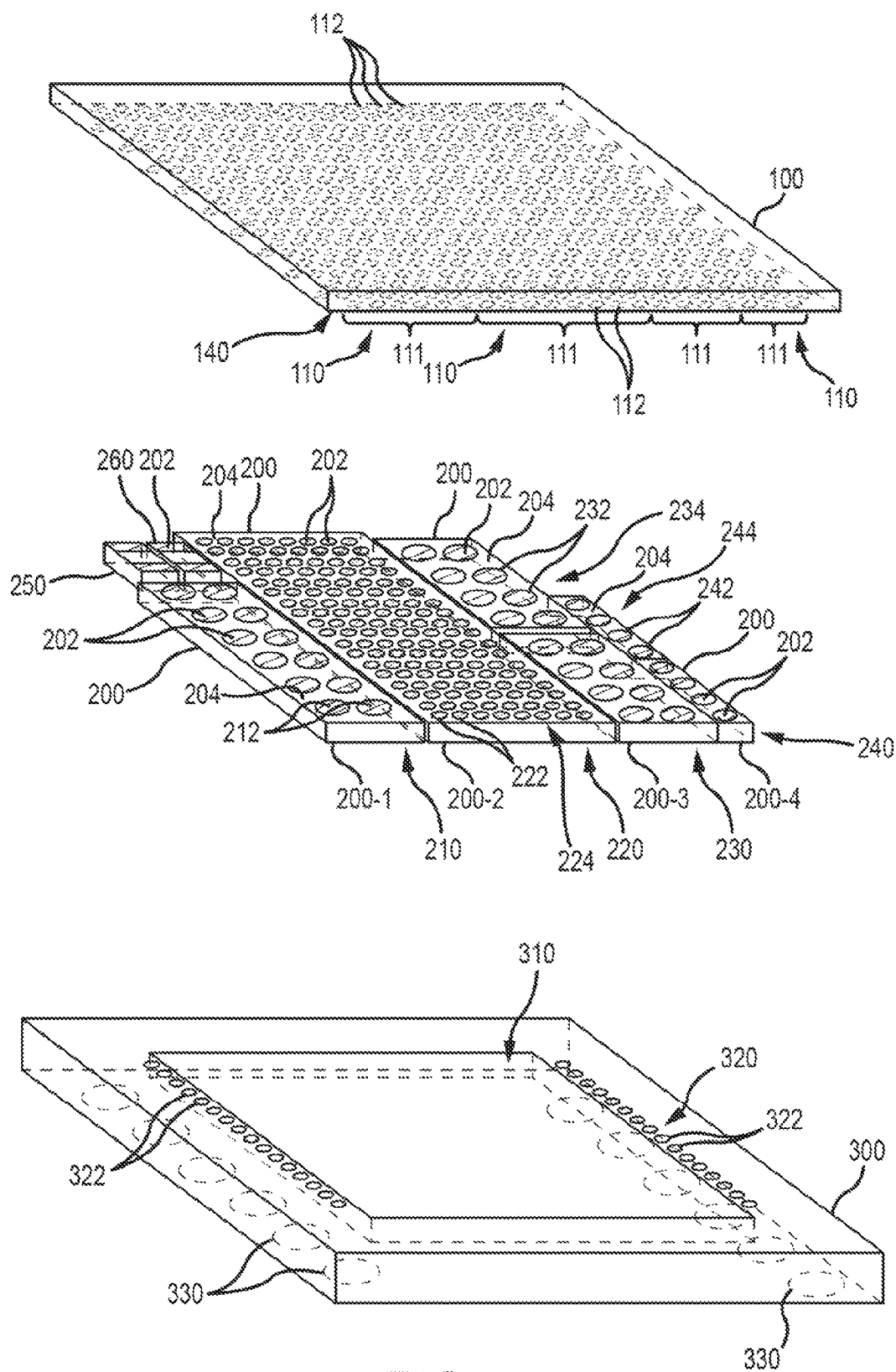
FIG. 4 is a simplified isometric exploded view illustrating certain components of the system in FIG. 2.
Figures 1, 7A:
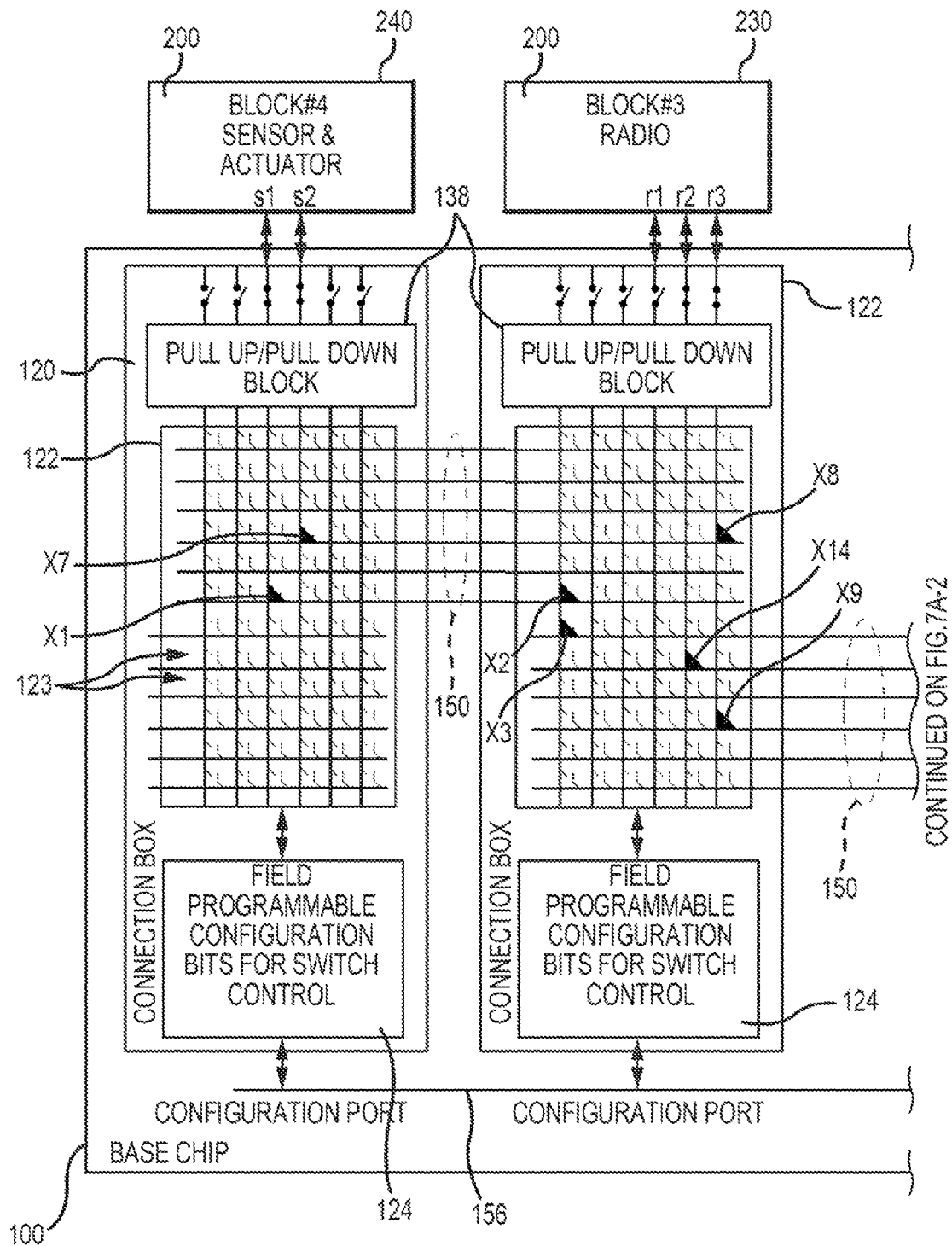
FIG. 7A is an illustration of an example of a base chip with a plurality of programmable cross-bar switches according to the present disclosure.
Figures 2, 7A:
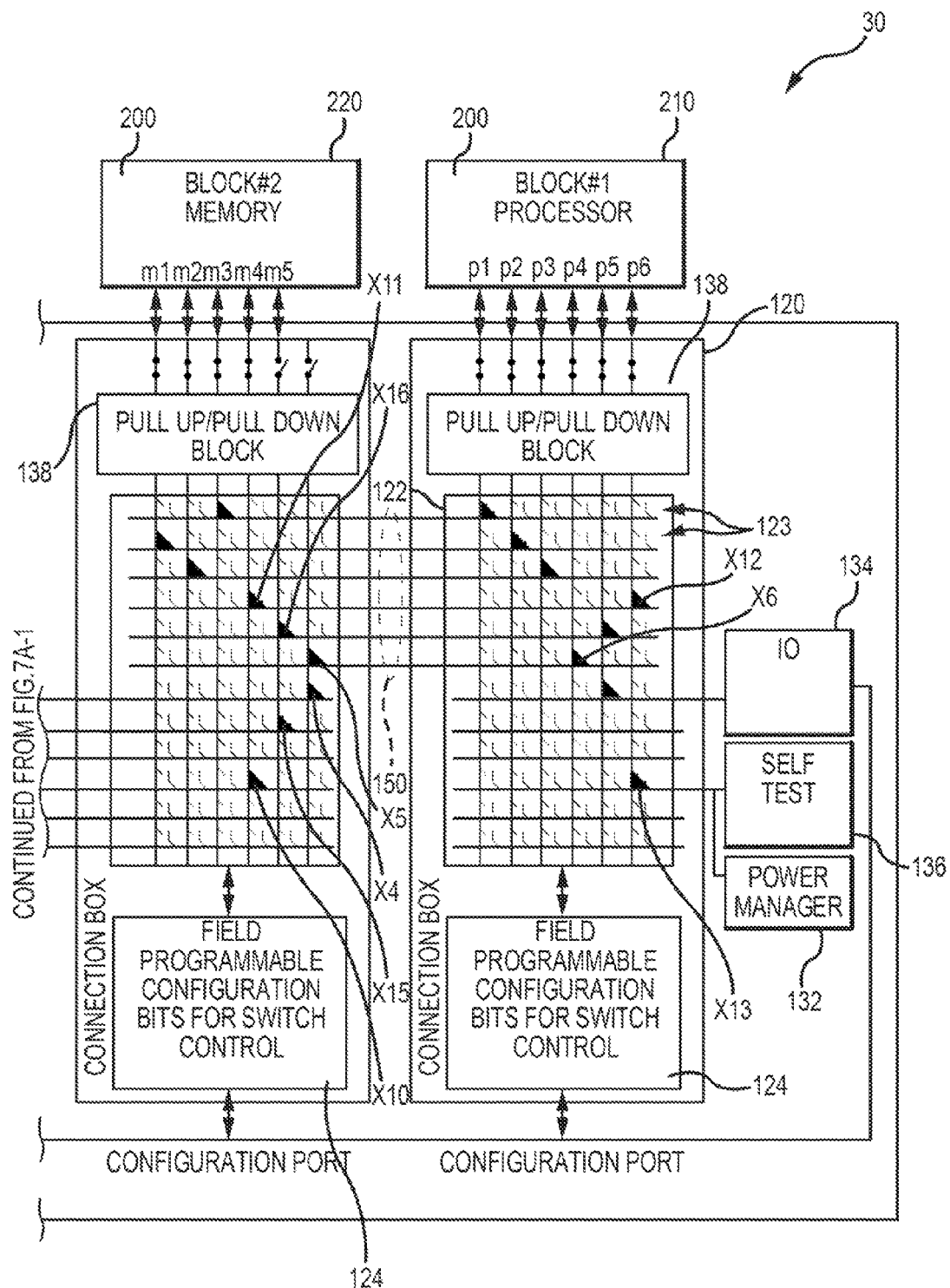
FIG. 2 is a simplified top view of a system including a base chip and a plurality of modular dies attached thereto according to examples of the present disclosure.

FIGS. 2-4 illustrate different views of system 20 according to examples of the present disclosure. System 20 includes base chip 100, a plurality of modular dies 200, and a package 300. FIG. 2 is a simplified top view of system 20, FIG. 3 is a simplified cross section view of system 20 taken along line 3-3 in FIG. 2, and FIG. 4 is a simplified exploded view of system 20. In the example in FIGS. 2-4, a plurality of dies 200 are coupled to base chip 100 to produce an embedded computing system 22. The specific number of individual dies shown in FIGS. 2-4 is illustrative only and it will be understood that embodiments comprising any number of dies programmed with any type of functionality are within the scope of the present disclosure.

In some examples, dies 200 according to the present disclosure may include circuitry configured to provide functionality of a processor, a memory, a sensor, an actuator, a receiver, a transmitter, application specific dies, or combinations thereof. In the examples herein system 20 includes a plurality of dies or modular components 200, including a first block 210 configured as a processor, a second block 220 configured as memory, a third block 230 configured as a radio, and a fourth block 240 configured as a sensor. System 20 may also include discrete components (e.g., components 250, 260), such as crystals, capacitors, and inductors as examples.

The plurality of dies 200 may include first die 200-1, comprising a first block 210, may include first die metal contacts 212 (e.g., first die surface bumps 212), second die 200-2, comprising a second block 220, may include second die metal contacts 222 (e.g., second die surface bumps 222), third die 200-3, comprising a third block 230, may include third die metal contacts 232 (e.g., third die surface bumps 232), and so on. Metal contacts 212 of any of the dies 200 may, but need not be, uniformly spaced apart. The dies 200 may have different shapes and sizes and may have differently pitched and sized metal contacts 202. As will be appreciated, individual ones of the fourth die surface bumps 242 are larger than individual ones of the second die surface bumps 222 but smaller than individual ones of the third die surface bumps 232. The surface bumps of individual dies may be arranged in regular or irregular arrays (e.g., array 224 of second die surface bumps, array 234 of third die surface bumps, array 244 of fourth die surface bumps.) The spacing between surface bumps in the arrays, also referred to as pitch, may vary. For example, the pitch of the surface bumps in array 244 may be finer than a pitch of the surface bumps in array 234 but coarser than a pitch of the surface bumps in array 224. The specific examples of die surface bumps shown in FIGS. 2-4 are provided for illustration purposes only and it will be understood that any combination of shapes, sizes and arrangement of metal contacts (e.g., surface bumps, strips, or the like) can be used in embodiments according to the present disclosure.

A die 200 may be mounted to base chip 100 by arranging the die and base chip in a face-to-face relationship, e.g., with their contact sides 204 and 140, respectively, facing each other such that at least some of the metal contacts of the base chip (e.g., surface bumps 112) are in physical contact with at least some of the metal contacts of the die (e.g., surface bumps 202). Contacting surface metal bumps may be fused to make electrical connections (also referred to herein as interconnects) between circuitry on the base chip 100 and circuitry on the die 200. As will be appreciated, known surface mount techniques for coupling dies or chips together in a face-to-face manner using solder bumps may have certain disadvantages. For example, great precision in manufacturing may be required to produce dies or chips with solder bump arrays having exact or near exact pitch. In addition, laborious alignment may be required to ensure that certain bumps of one die are in the precise location required to be in contact with certain bumps of the mating die. Systems and methods for producing stacked integrated circuits (e.g., embedded computing system 22) according to the present disclosure may reduce required manufacturing precision and simplify the assembly of embedded computing systems.

The embedded computing system 22 may be coupled to a package 300 e.g., to protect sensitive components of system 22 from physical damage. Package 300 may enclose at least a portion of system 22 and thus provide additional strength and rigidity to system 22. In some examples, package 300 may fully or partially enclose dies 200 and/or base chip 100. In the example in FIGS. 2-4, package 300 includes a cavity or recess 310. Base chip 100 may be coupled to package 300 with contact side 140 of base chip 100 facing cavity 310 such that dies 200 are received in the recess 310 of package 300 when base chip 100 is coupled to package 300. In this manner, package 300 may protect the dies and metal connections from damage. Cavity 310 may provide the added advantage of a lower profile design by reducing the overall thickness of system 20. Package 300 may include metal pads 320 and connectors 330 for electrically coupling the embedded computing system 22 to external components (e.g., circuit board of a larger computing system and/or additional power source).

Figure 5:
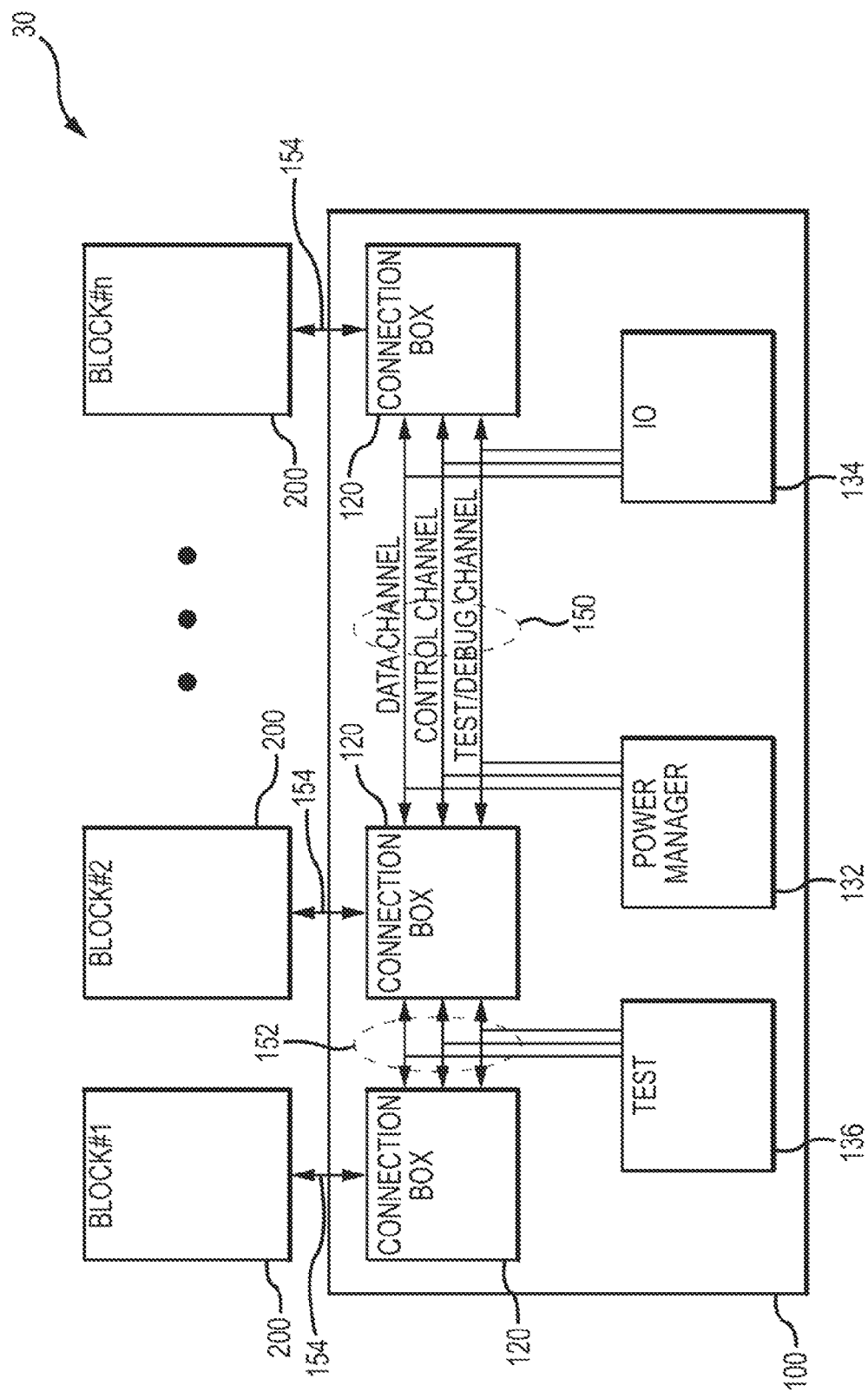
FIG. 5 is a functional block diagram of a system according to the present disclosure.
Figure 6:
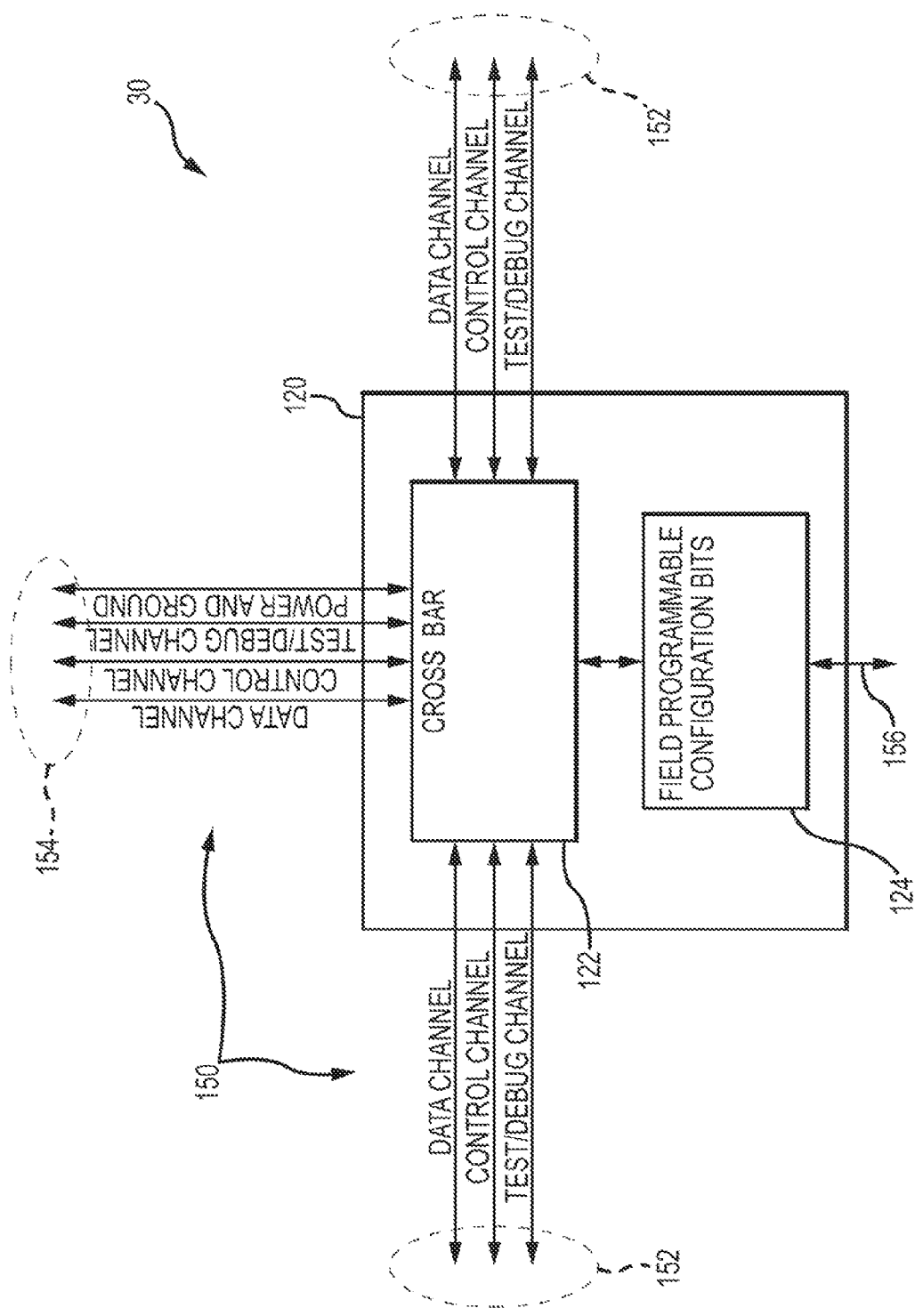
FIG. 6 is a functional block diagram of a configurable connection box according to the present disclosure.

With reference now to FIGS. 5-7, features of base chip 100 are described in further detail. FIG. 5 shows a functional block diagram of a system 30 (e.g., embedded computing system 22), which includes a base chip 100 and a plurality of modular blocks 200 coupled to base chip 100. Base chip 100 includes a plurality of connection boxes 120 each associated with an attachment slot 110 of base chip 100. Base chip 100 includes a plurality of buses 150 (e.g., horizontal busses and vertical busses). Horizontal buses 152 are used for information pass through. Horizontal busses may include data channels, control channels, and test/debug channels. Vertical buses 154 (e.g., buses entering connection boxes from the contact side of base chip 100) are used to connect modular components 200 to base chip 100. Vertical busses may include data channels, control channels, test/debug channels, and power supply connections. Channels and signal lines may be interchangeably used herein. As described previously, base chip 100 may also include power management circuitry (e.g., power management signal module 132), input/output circuitry (e.g., I/O module 134) and test and alignment circuitry (e.g., test and configuration module 136). Base chip 100 may also include circuitry (e.g., blocks 138 of FIG. 7A) configured to provide pull-up/pull-down functionality e.g., for preventing electrical nodes from floating and also to provide power and ground connections.

The connection boxes 120 may be programmable at the time of manufacture as well as in the field during run-time. That is, base chip 100 may be field and/or factory programmable by virtue of the programmability of connection boxes 120. As such, the connection boxes 120 may be interchangeably referred to herein as configurable connection boxes 120. In some embodiments, one or more of the connection boxes 120 may be implemented using a programmable cross bar switch 122 as shown in FIGS. 6 and 7.

Referring now to FIGS. 6 and 7, connection box 120 may comprise cross bar switch 122, which may be associated with a particular attachment slot 110 of base chip 100. As shown in FIG. 7A, cross bar switch 122 comprises a plurality of switches 123 arranged in a matrix configuration. Cross bar switch 122 further comprises a plurality of input/output (I/O) channels that form a crossed pattern of interconnecting lines between which a connection may be established by closing a switch located at a given intersection.

Cross bar switches 122 of base chip 100 may be programmable based on configuration data stored onboard or transmitted to respective connection boxes 120 of base chip 100. Connection box 120 may include a memory element 124 (also referred to herein as field programmable configuration block 124), which may be configured to store configuration data for programming input/output channels of cross bar switch 122. Configuration data may be loaded onto the field programmable configuration block 124 via a configuration bus 156. In some examples, configuration data corresponding to a desired circuit schematic may be loaded onto base chip 100. The configuration data may be used to configure the on/off states of the individual switches 123 of cross bar switches 122 in order to provide a desired connectivity. Table 160 in FIG. 7B shows interconnects formed by configuration data loaded onto base chip 100 to provide the example connectivity scheme shown in FIG. 7A.

As will be appreciated, individual attachment slots 110 may include a greater number of attachment signal lines (also referred to herein as pins) available than may be needed by a particular component 200. For example, an individual attachment slot 110 may include a plurality of metal contacts (e.g., base chip surface bumps) and each individual bump may function as an attachment signal line. An individual die attached to base chip 100 may include the same or smaller number of metal contacts (e.g., die surface bumps) as compared to the number of base chip surface bumps. That is, an individual block attached to the base chip may include a plurality of signal lines and may have all or some of its signal lines electrically coupled to signal lines of other blocks in the modular dies and the base chip. In some examples, only a portion of the metal contacts associated with a given attachment slot 110 may be active (e.g., electrically coupled to another metal contact and/or circuitry on the base chip 100).

Figure 7B:
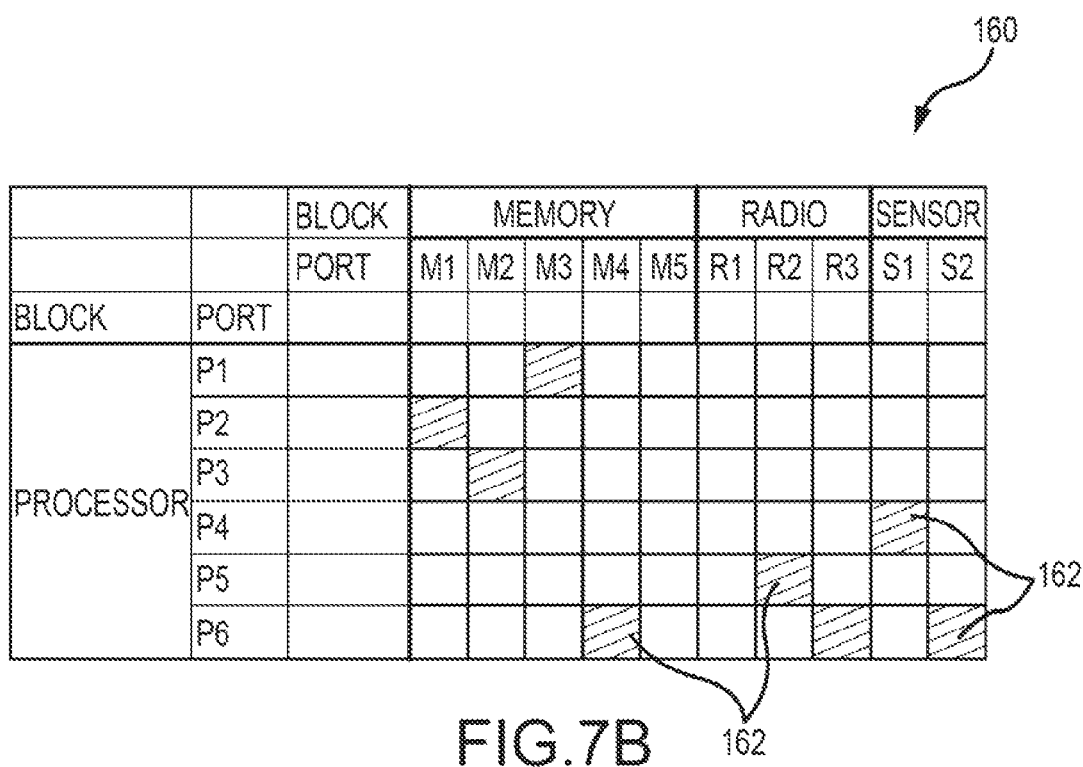
FIG. 7B is a configuration table comprising configuration data for programming the cross-bar switches in the example in FIG. 7A.

In the example in FIGS. 7A and 7B, sensor block 240 has two signal lines and both signal lines s1 and s2 of sensor block 240 are electrically connected by one or more of the cross bar switches to other blocks on the base chip and attached dies. Specifically, signal line s1 of the sensor block 240 may be coupled to signal line p4 of processor block 210 by closing switches x1 through x6, and signal line s2 of the sensor block 240 may be coupled to signal line r3 of radio block 230, signal line m4 of memory block 220, and signal line p6 of processor block 210, as well as to base chip blocks (e.g., blocks 132, 134, and 136 of base chip 100) by closing switches x7 through x13. Radio block 230 has three signal lines and two of the signal lines are electrically coupled to base chip 100 and to block on the dies via the base chip. As noted above, signal line r3 of radio block 230 is coupled to signal line s2 of the sensor block 240, signal line m4 of memory block 220, and signal line p6 of processor block 210, as well as to base chip blocks (e.g., blocks 132, 134, and 136 of base chip 100) via the switches x7 through x13. Signal line r2 of radio block 230 is coupled to signal line p5 of processor block 210 via switches x14-16, and signal line r1 of radio block 230 is decoupled. Memory block 220 comprises 5 signal lines, four of which are coupled and processor block 210 has all of its signal lines connected to the base chip and to other component blocks via the base chip 100. In this manner, virtually any desired combination of electrical connections can be programmed into the cross bar switches 122 of each connection box 120 in order to couple virtually any combination of components 200 together.

As previously described, base chip 100 may include a test and configuration block (e.g., block 136), which may provide certain test and alignment functionality as well as enable programmability of configurable connection boxes 120 of base chip 100. For example, the test and configuration block may include circuitry configured to generate test signals for determining connectivity between metal contacts of the base chip and metal contacts of a die attached to the base chip. In further examples, the test and configuration block may be configured to receive configuration data for programming one or more of the cross bar switches of base chip 100. With reference now to FIGS. 8-14, test and alignment functionality of base chips according to the present disclosure will be further described.

Figure 8:
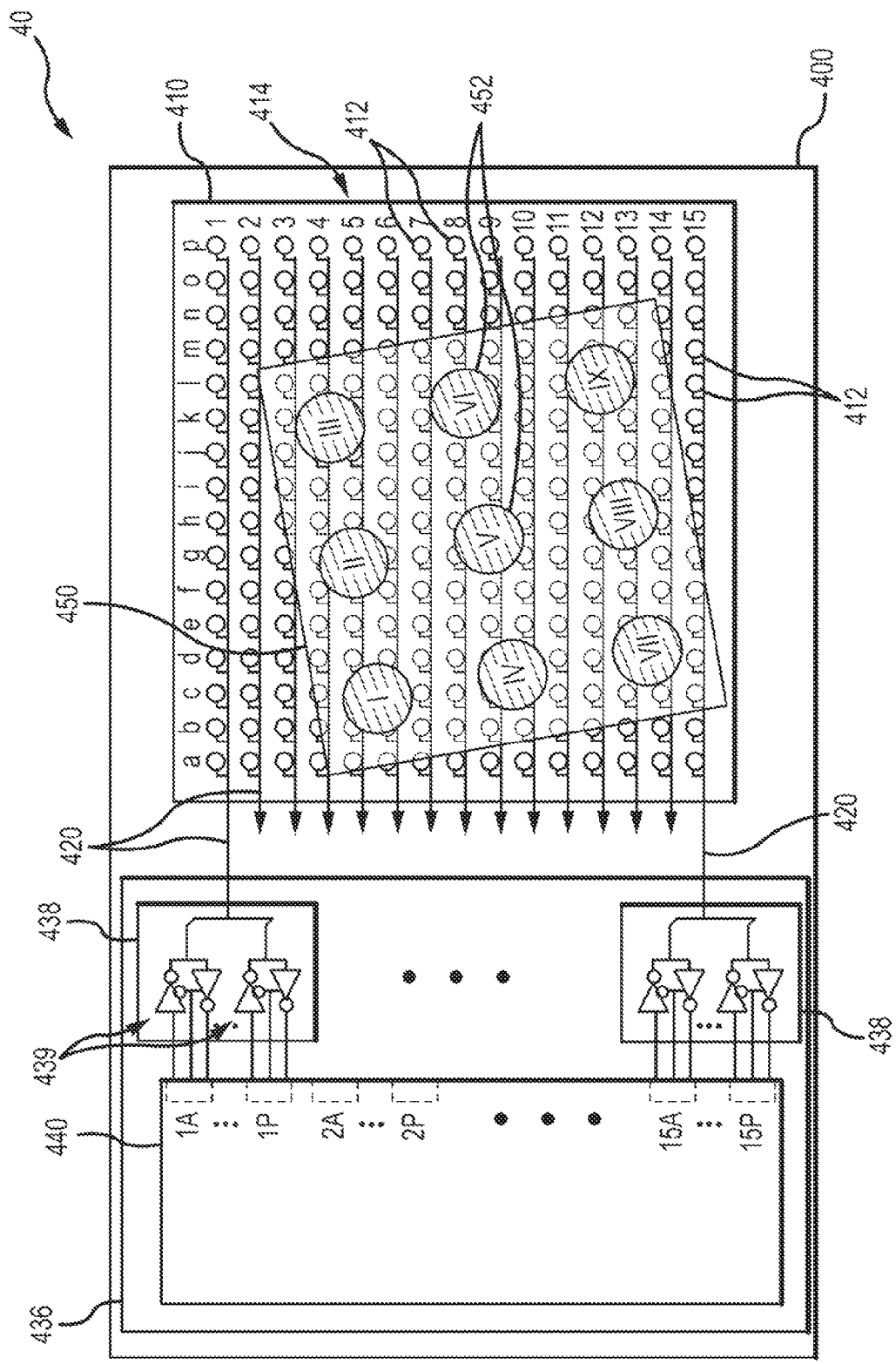
FIG. 8 is a block diagram of a system according to some examples of the present disclosure.
Figure 9A:
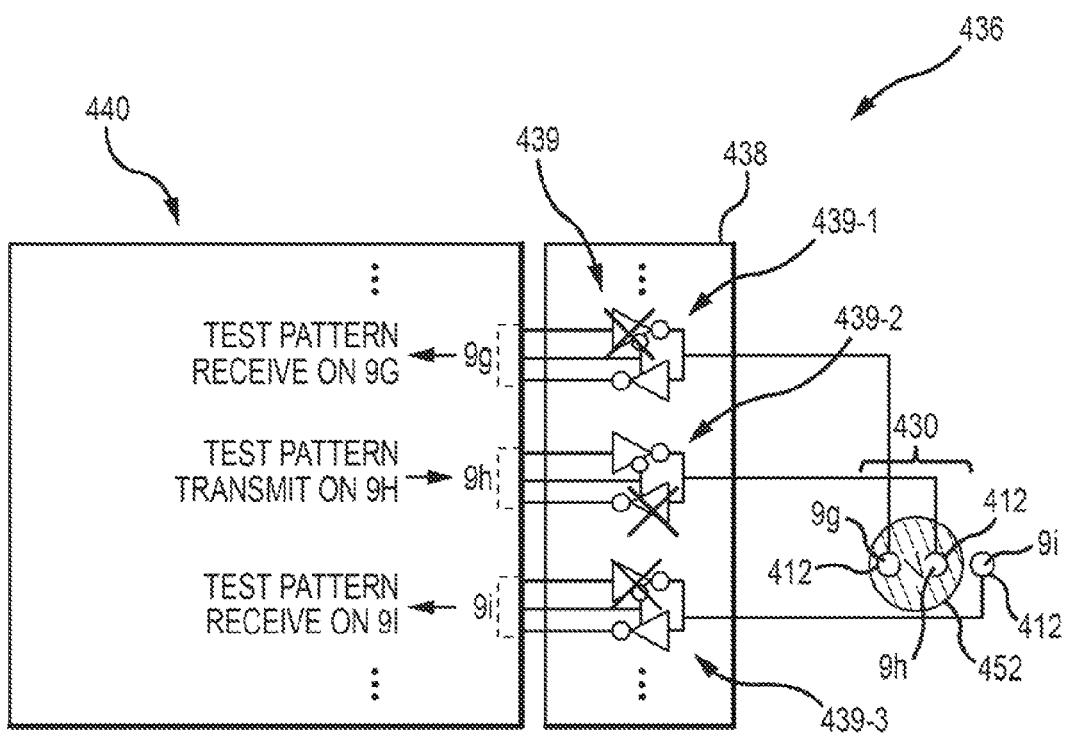
FIG. 9A is a block diagram of certain components of the system in FIG. 8 according to some examples of the present disclosure.
Figure 9B:
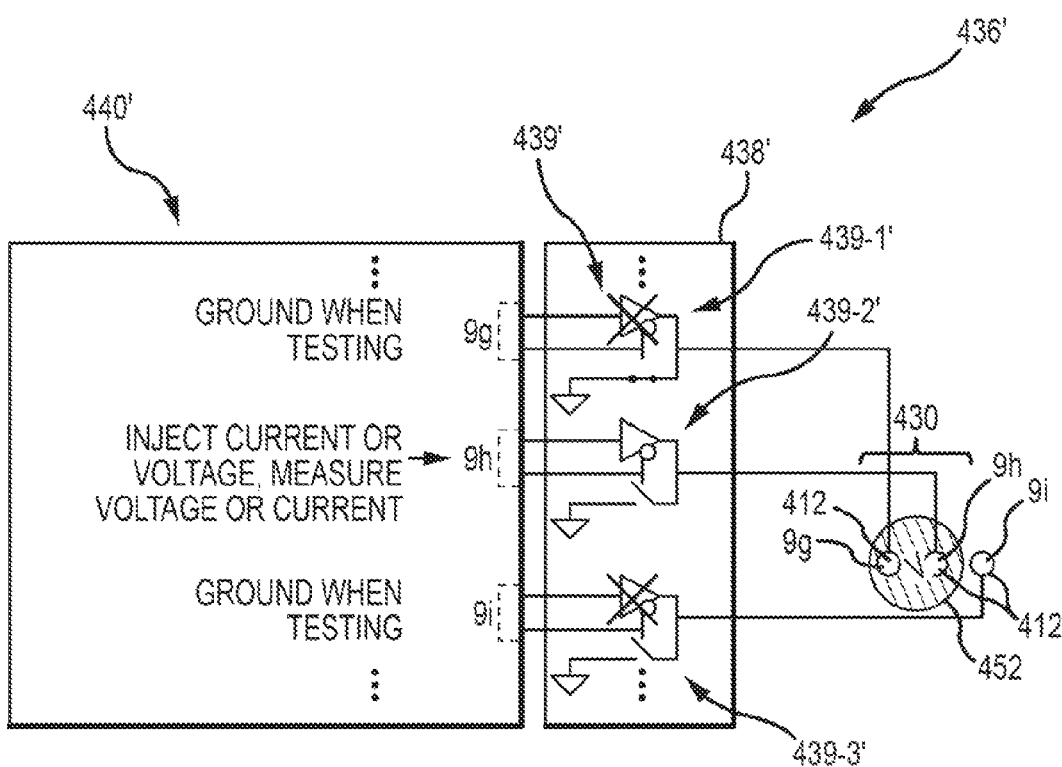
FIG. 9B is a block diagram of certain components of the system in FIG. 8 according to further examples of the present disclosure.

FIG. 8 shows a system 40 according to some examples of the present disclosure. System 40 may include some or all of the features of systems 10, 20, 30 described herein. For example, system 40 may include a base chip 400 comprising an array 414 of surface bumps 412 associated with attachment slot 410 of base chip 400. Base chip 400 may also include a test and configuration block 436. Each of the base chip surface bumps 412 in the array are coupled to the test and configuration block 436 via test busses 420. FIGS. 9A and 9B show test and configuration blocks 436, 436' according to some examples of the present disclosure.

Referring now to FIGS. 8 and 9, a die 450 may be coupled to the attachment slot 410. As illustrated, die 450 comprises a plurality of die surface bumps 452, e.g., bumps I-IX. The base chip bumps 412 are arranged in an array comprising a finer pitch than the pitch of die surface bumps 452. As such, when die 450 is coupled to base chip 400 the die surface bumps 452 and base chip surface bumps 412 are said to be in a one-to-many configuration. Base chip 400 may be configured to accommodate any variety of dies having any number and/or size of surface bumps. In some examples, die surface bumps may have the same size and/or pitch of base chip bumps. For example, in embodiments in which the base chip bumps and die surface bumps are of the same or nearly the same size, the base chip and die bumps may be in a one-to-one configuration, as described further with reference to FIGS. 12 and 13.

Base chip 400 includes test and configuration block 436 configured to resolve misalignment between base chip 400 and die 450 by determining connectivity between base chip surface bumps 412 and die surface bumps 452. In the example in FIG. 8, the attachment slot 410 comprises a 15×16 array of base chip surface bumps 412 arranged in rows 1 through 15 and columns a through p. For purposes of illustration, each base chip surface bump 412 is identified by an alphanumeric character (e.g., 1a-15a correspond to bumps in the first column of the array of base chip surface bumps), however it will be understood that the number of bumps and particular arrangement shown in FIG. 8 is exemplary only and does not limit the scope of the disclosure. Similarly, the number and arrangement of die chip surface bumps 452, e.g., bumps I-IX, are also illustrative only and not limiting.

When a die is positioned onto a base chip according to the present disclosure, individual one of the die surface bumps may be in physical contact, and may thus be electrically connected, with one or more of the base chip bumps. In the example in FIG. 8, die surface bump IV is in contact with base chip surface bumps 9c, 10c, 9d, and 10d. Die surface bump V is in contact with at least base chip surface bumps 9g and 9h but is not in contact with base chip surface bump 9i.

Test and configuration block 436 includes circuitry for transmitting and receiving test signals which may be used to determine electrical connectivity between base chip 400 and die 450 after attachment of die 450 to base chip 400. Test and configuration block 436 may include additional circuitry 440 configured to perform additional functionality as will be described further below, as will be further described with reference to FIGS. 14 and 15.

In some examples, test and configuration block 436 may include one or more test head blocks 438. Test head block 438 may comprise a plurality of transmit/receive blocks 439, each coupled to individual ones of the base chip surface bumps 412. The transmit/receive blocks 439 are configurable to transmit and receive test signals to and from the individual bumps to which they are coupled. During an alignment test, one of the transmit/receive blocks 439 is configured to send a test signal to the base chip surface bump 412 to which the particular transmit/receive block is coupled to. Other ones of the transmit/receive blocks 439, for example transmit/receive blocks coupled to neighboring base chip surface bumps, are configured to function as listener blocks (e.g., these transmit/receive blocks are configured to receive a response signal in response to the test signal). As will be appreciated, a response signal will be received from base chip surface bumps that are electrically shorted together due to being connected to the same die surface bump and will not be received from base chip surface bumps that are isolated.

In the example in FIG. 9A, base chip bump 9g is coupled to transmit/receive block 439-9g, base chip bump 9h is coupled to transmit receive block 439-9h, and base chip bump 9i is coupled to transmit/receive block 439-9i. During a test procedure, block 439-9h may be configured to transmit a test pattern to a receiving bump (e.g., bump 9h) while listener blocks (e.g., blocks 439-9g and 439-9i) are configured to receive the test pattern from neighboring bumps 9g8, 9i. The test pattern is received at listener block 439-9g by virtue of listener block 439-9g being coupled to bump 9g that is electrically connected to the same die surface bump (e.g., bump V) to which receiving bump 9h is connected. The test pattern is not received on 439-9i as it is not electrically connected to 439-9h. The receiving bump and all shorted bumps are grouped together into a set of electrically connected bumps 430. This test procedure is repeated for all base chip surface bumps 412 to identify additional sets of electrically connected bumps. Information about the identified sets of electrically connected bumps (e.g., alignment information) may be stored and subsequently used to configure routing of signals between the base chip and dies attached thereto.

FIG. 9B shows a test and configuration block 436' according to further examples of the present disclosure. In the example in FIG. 9B, instead of using a test pattern, analog electrical parameters are measured to determine the connections and their quality. Similar to test and configuration block 436, test and configuration block 436' includes circuitry for transmitting and receiving test signals for determining the connectivity between base chip 400 and die 450 after attachment of die 450 to base chip 400. For example, test and configuration block 436' may include one or more test head blocks 438'. Test and configuration block 436' may include additional circuitry 440' which may include one or more of the functionalities of circuitry 440.

Test head block 438' may comprise a plurality of test blocks 439', each coupled to individual ones of the base chip surface bumps 412. The transmit/receive test blocks 439' are configurable to transmit and receive test signals from the individual bumps. In this case, instead of sending a test pattern as with the example in FIG. 9A, a base chip surface bump under test (e.g., bump 9h) is driven by a voltage signal or a current signal, while neighbor bump(s) (e.g., bumps 9g and 9i) are grounded. A change in current or voltage at neighbor bumps is measured to determine electrical connectivity between neighbor bumps. In some examples, a bump-pair configuration is used when making electrical measurements. That is, one bump in the pair is driven while a second neighbor bump in the pair is grounded and remaining ones of the neighbor pairs are electrically floating. In other examples, a multi-bump configuration is used in which multiple neighbor bumps to the driven bump are grounded (e.g., as shown in FIG. 9B). Test results may be stored and subsequently used to determine alignment and to configure bump connections.

Figure 10:
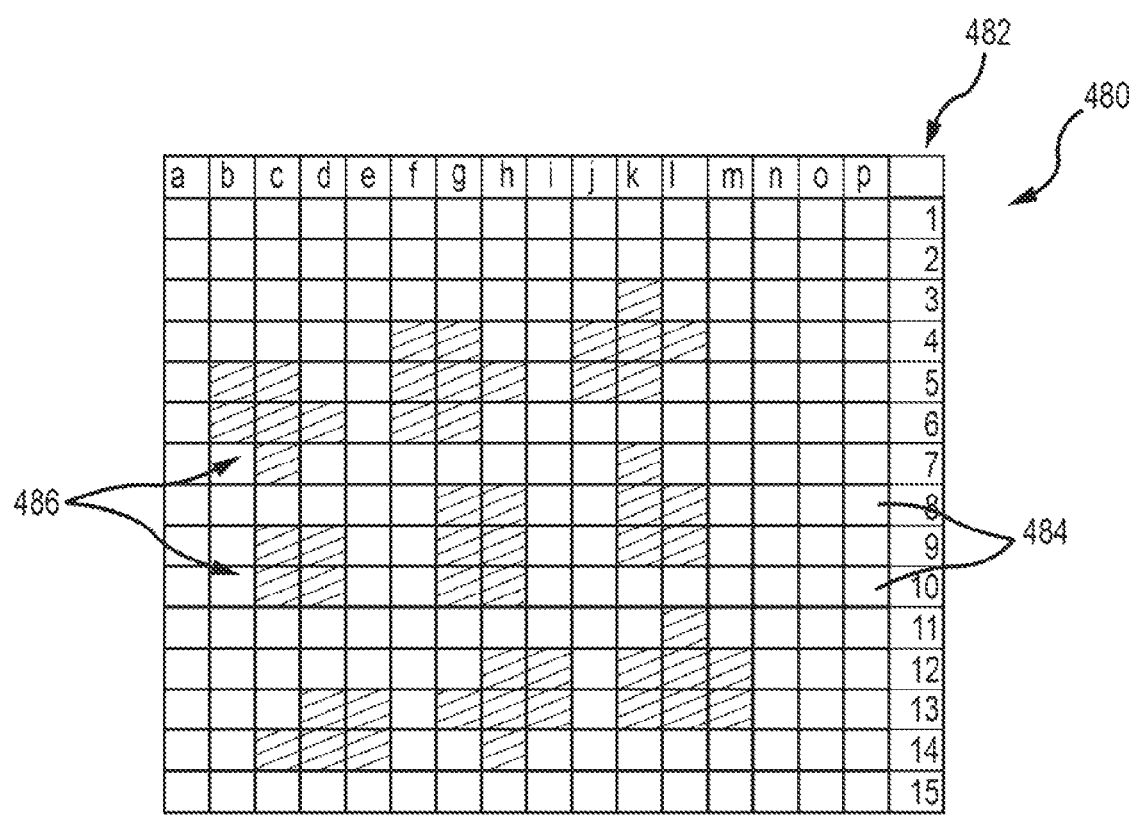
FIG. 10 is an example of a contour map of electrically connected bumps according to the present disclosure.

As will be appreciated, in a one-to-many configuration, one or more base chip surface bumps may be connected to a single die surface bump. FIG. 10 illustrates an example of a connectivity contour map 480 that may be generated using the test and configuration block 436, 436'. The connectivity contour map 480 indicates the base chip surface bumps that are connected to die surface bumps. The map comprises an array 482 of cells 484, which has a corresponding size to the array in FIG. 8 (e.g., rows 1 through 15 and columns a through p). Individual cells 484 in the array 482 correspond to individual ones of the base chip surface bumps 412 and accordingly are labeled with corresponding alphanumeric characters. The cells which are shaded on the connectivity contour map 480 correspond to base chip surface bumps that are electrically connected to die chip surface bumps. A cluster 486 of shaded cells corresponds to a group of base chip surface bumps that are connected to the same die surface bump. In the example in FIG. 10, each of the nine clusters 486 of shaded cells corresponds with a group of connected base chip surface bumps (also referred to herein as groups or sets of electrically connected bumps) which are in contact with a die chip bump. Individual bumps in group of connected base chip surface bumps are routed together, e.g., by setting a group of switches coupled to the group of connected base chip surface bumps to the same On or Off state as may be desired.

Figure 11:
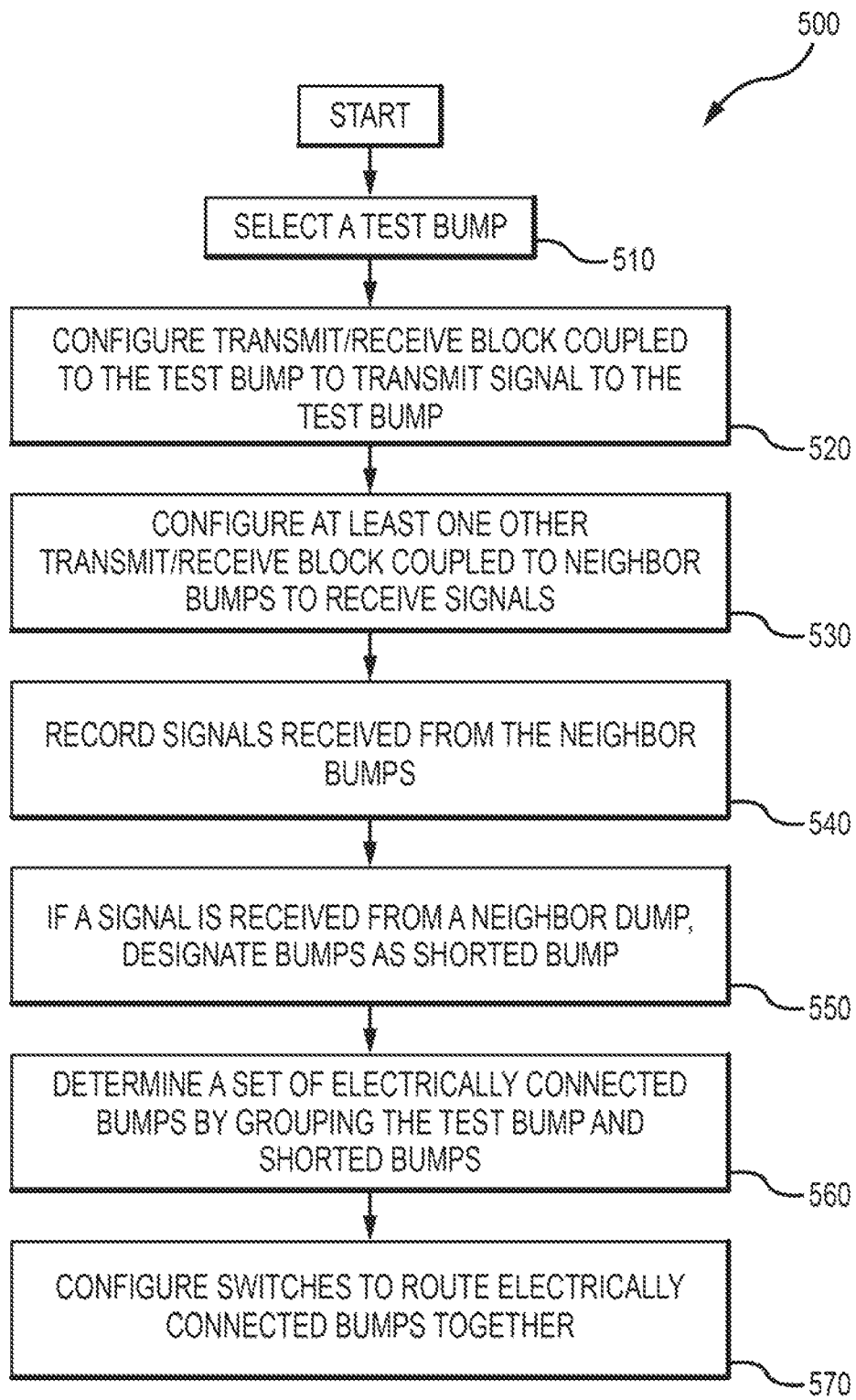
FIG. 11 is a flow diagram of a method for test and alignment according to some examples herein.

FIG. 11 shows a flowchart of a method 500 for test and alignment according to the present disclosure. The method 500 may be used to determine bump connections in a one-to-many configuration. Certain steps of test procedure 500 may be embodied in test and configuration block 436, 436'.

Figure 12:
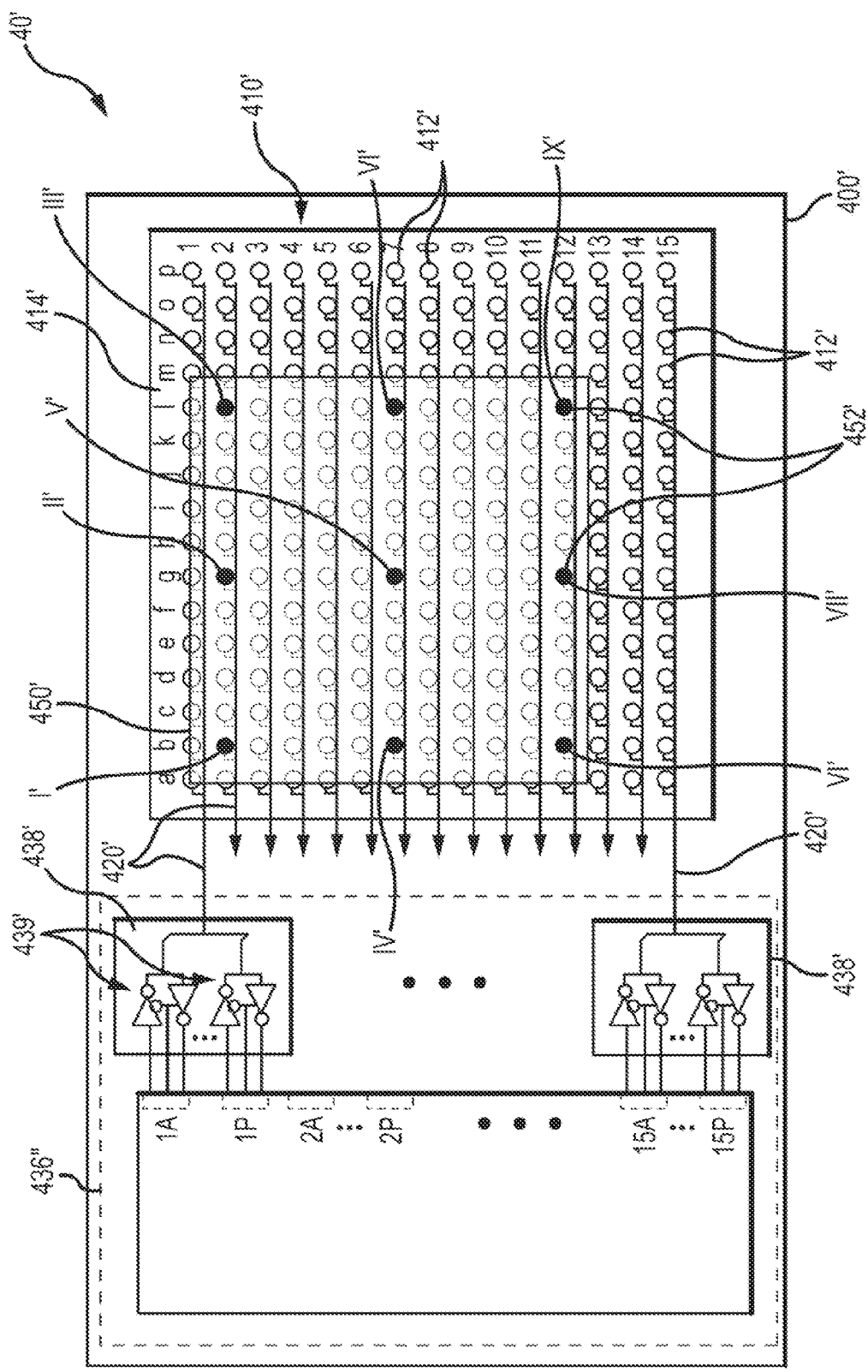
FIG. 12 is a block diagram of a system according to further examples of the present disclosure.

The method starts by selecting a base chip surface bump (e.g., test bump) for testing, as shown in box 510. Next, a transmit/receive block coupled to the test bump is configured to transmit a test signal to the test bump, as shown in box 520. Transmit/receive blocks coupled to adjacent base chip surface bumps, also referred to herein as neighbor bumps, are configured to receive signals, as shown in box 530. A test signal is sent to the test bump and responses for the neighbor bumps are recorded, as shown in box 540. If a response is recorded for a neighbor bump, then that neighbor bump has an electrical connection with the bump under test and, therefore, will be routed together with the bump under test. In other words, if a response signal is received from a given neighbor bump, that neighbor bump in designated as a shorted bump, as shown in box 550. The test bump and shorted bumps are grouped into a set of electrically connected bumps, as shown in box 560. These steps are repeated to determine a plurality of groups or sets of electrically connected bumps. After the sets of electrically connected bumps have been identified, switches are configured to route electrically connected bumps together, as shown in box 570. Routing for input/output channels of the cross bar switches may be programmed for one or more of the sets of electrically connected bumps base on configuration data loaded onto the base chip. In some examples, testing of all base chip surface bumps may not be needed as proper alignment and connectivity between the base chip and a die attached thereto may be achieved after identification of a subset of the base chip surface bumps. In other words, identifying at least one bump of the attached die that is electrically coupled to signal lines of the base chip may be sufficient, for example in cases in which the attached die only has translational misalignment (e.g., misalignment in a lateral direction) and no rotational misalignment (e.g., misalignment in a radial direction) in the connection to the base chip. Identifying at least two bumps of the attached die that are electrically coupled to signal lines of the base chip may be sufficient, for example in cases in which the attached die has rotational misalignment in the connection to the base chip. It will be understood that test and configuration block (e.g., block 436 or 436') of base chip 400 may be used to resolve misalignment in any direction including a radial direction (as shown in FIG. 8) and/or lateral directions (as shown in FIG. 12).

As previously described, die surface bumps may have the same size and/or pitch of base chip surface bumps. FIG. 12 shows an example of a system 40' according to further examples of the present disclosure. System 40' may include some or all of the features of systems (e.g., systems 10, 20, 30) described herein. System 40' includes a base chip 400'. Base chip 400' may include some or all of the features of base chips according to the present disclosure. For example, base chip 400' may include at least one attachment slot 410' and a plurality of base chip surface bumps 412' associated with attachment slot 410'. The base chip surface bumps 412' are arranged in an array 414'. In this example, a 15×16 array is illustrated but the array of base chip surface bumps 412' may have virtually any size. The base chip surface bumps 412' are arranged in an array comprising rows 1 through 15 and columns a through p. Similar to the example in FIG. 8, for clarity of illustration individual ones of the base chip surface bumps are identifies by an alphanumeric character (e.g., bumps 2a through 2p are base chip surface bumps arranged in the second column of the array). System 40' also includes a test and configuration block 436", and each of the base chip surface bumps 412' are coupled to the test and configuration block 436" via test busses 420'. Test and configuration block 436" may include some or all of the features of test and configuration blocks 436, 436'.

A die 450' may be coupled to base chip 400' at attachment slot 410'. Die 450' may include a plurality of die surface bumps 452' (e.g., bumps I'-IX'). The base chip surface bumps 412' have the same size as die surface bumps 452'. The die surface bumps are spaced such that an individual one of the die surface bumps contact only one base chip surface bump. As such, base chip 400' and die 450' may be said to be in a one-to-one configuration. It will be appreciated that the die 450' need not have a same number of bumps and the number of base chip bumps. For example, die 450' may have a fewer number of die surface bumps, as in the example shown in FIG. 12. However a die with the same or nearly the same array of bumps (e.g., same size, pitch and number) as the array of base chip bumps is within the scope of this disclosure. As can be observed, die 450' is not centered over the attachment slot 410'. Test and configurations block 436" of base chip 400' may be configured to resolve such lateral misalignment of a die attached to base chip 400'.

Test and configuration block 436" includes circuitry for transmitting and receiving test signals which may be used to determine connectivity between base chip 400' and die 450' after attachment of die 450' to base chip 400'. Test and configuration block 436" may include additional circuitry configured to perform additional functionality as described herein.

Test and configuration block 436" may include one or more test head blocks 438', which comprises a plurality of transmit/receive blocks 439', each coupled to individual ones of the base chip surface bumps 412'. Transmit/receive blocks 439' are configurable to transmit and receive test signals to and from the individual bumps to which they are coupled. During an alignment test, one of the transmit/receive blocks 439' is configured to send a test signal to base chip surface bump 412' to which the particular transmit/receive block is coupled to. Transmit/receive blocks 439' coupled to other base chip surface bumps are configured to receive a response signal in response to the test signal.

Figure 13:
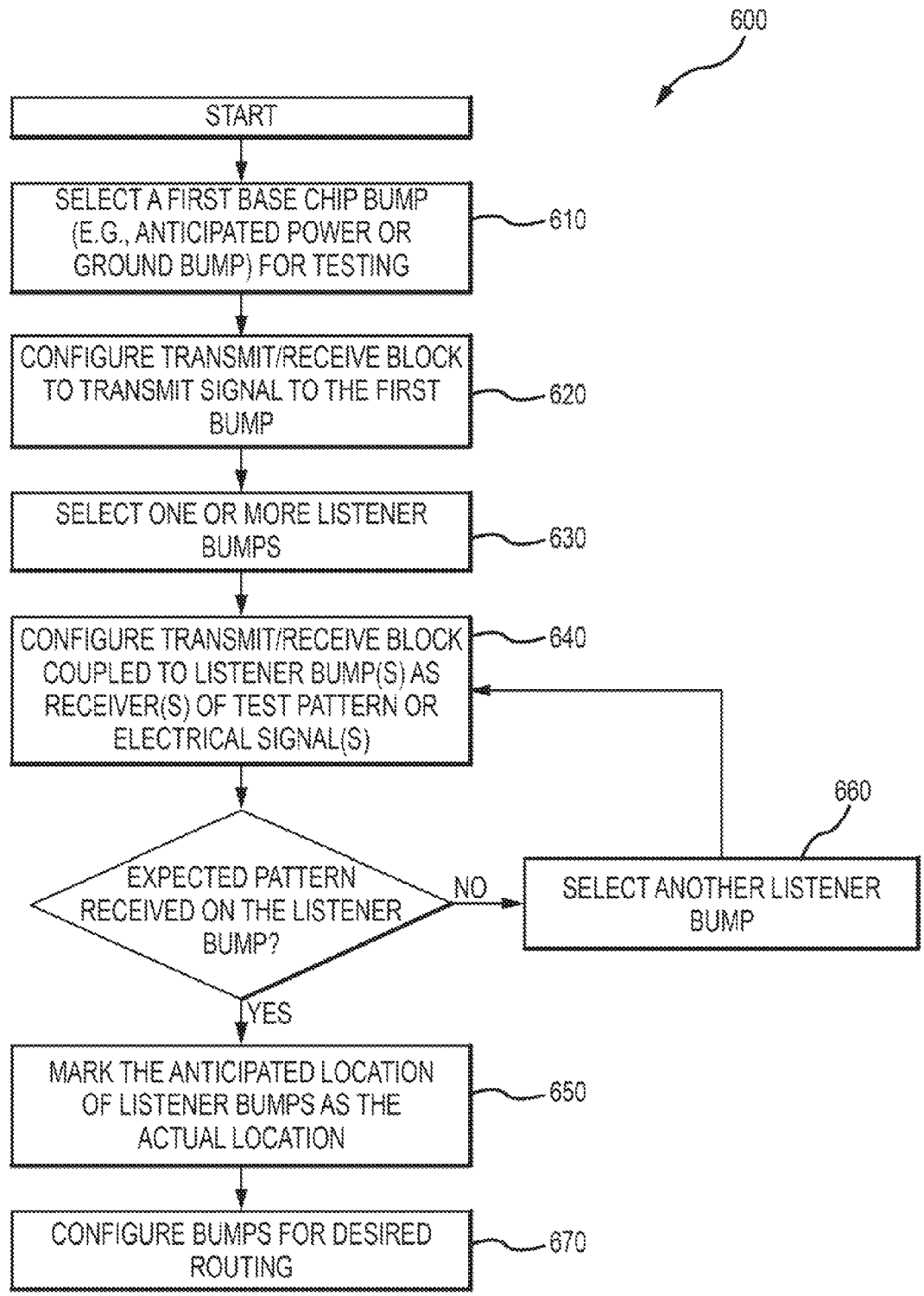
FIG. 13 is a flow diagram of a method for test and alignment according to further examples herein.

Referring also to FIG. 13, a method 600 for determining bump connections in a one-to-one configuration is now described. Method 600 starts by selecting a base chip bump that is anticipated to be used as a power (or ground or signal) bump, as shown in box 610. Transmit/receive block coupled to the selected bump is configured for test signal transmission. Based on a similar anticipation there are other anticipated power (or ground or signal) bumps shorted through the attached die power (or ground or signal) grids so the method continues by selecting additional bumps anticipated to be used as power or ground bumps as listener bumps and configuring transmit/receive blocks coupled to these additional bumps to receive signals (e.g. listener blocks), as shown in boxes 630 and 640. The test method is based on verifying this anticipation by injecting the test signal in the bump under test and listening for the response on the other anticipated bumps connected to the same power (or ground) grid. Test signals are then transmitted on the bump under test and the response is listened for on the anticipated bumps connected to the same power or ground grid—also referred to as listener bumps. If the test signals are received on the listener bumps as anticipated then their location(s) is recorded as corresponding to verified die attachment location(s), as shown in box 650 and may subsequently be used for coupling signal lines there through. If the anticipated response is not received then the anticipation is incorrect and other combinations of anticipated listener bumps will be tested for, as shown in box 660. After completion of this sequence for all or some of the bumps on the base chip, a routing configuration is determined for all or some of the bumps and programmed into the connection boxes, as shown in box 670. In order to achieve proper alignment and connectivity, identification of only a few bumps may be sufficient.

Figure 14:
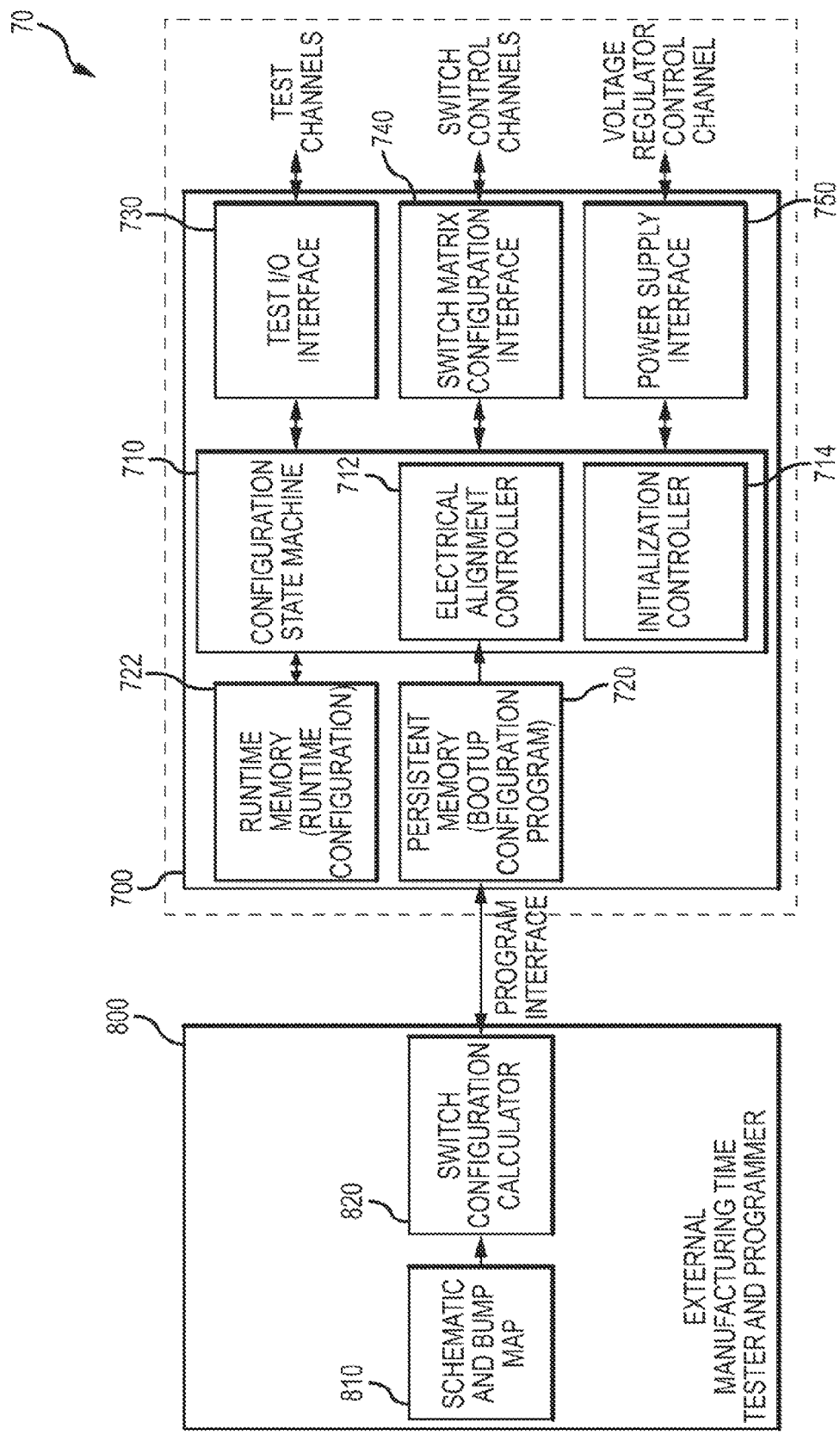
FIG. 14 is a block diagram of a system including a test and configuration block according to some examples of the present disclosure.
Figure 15:
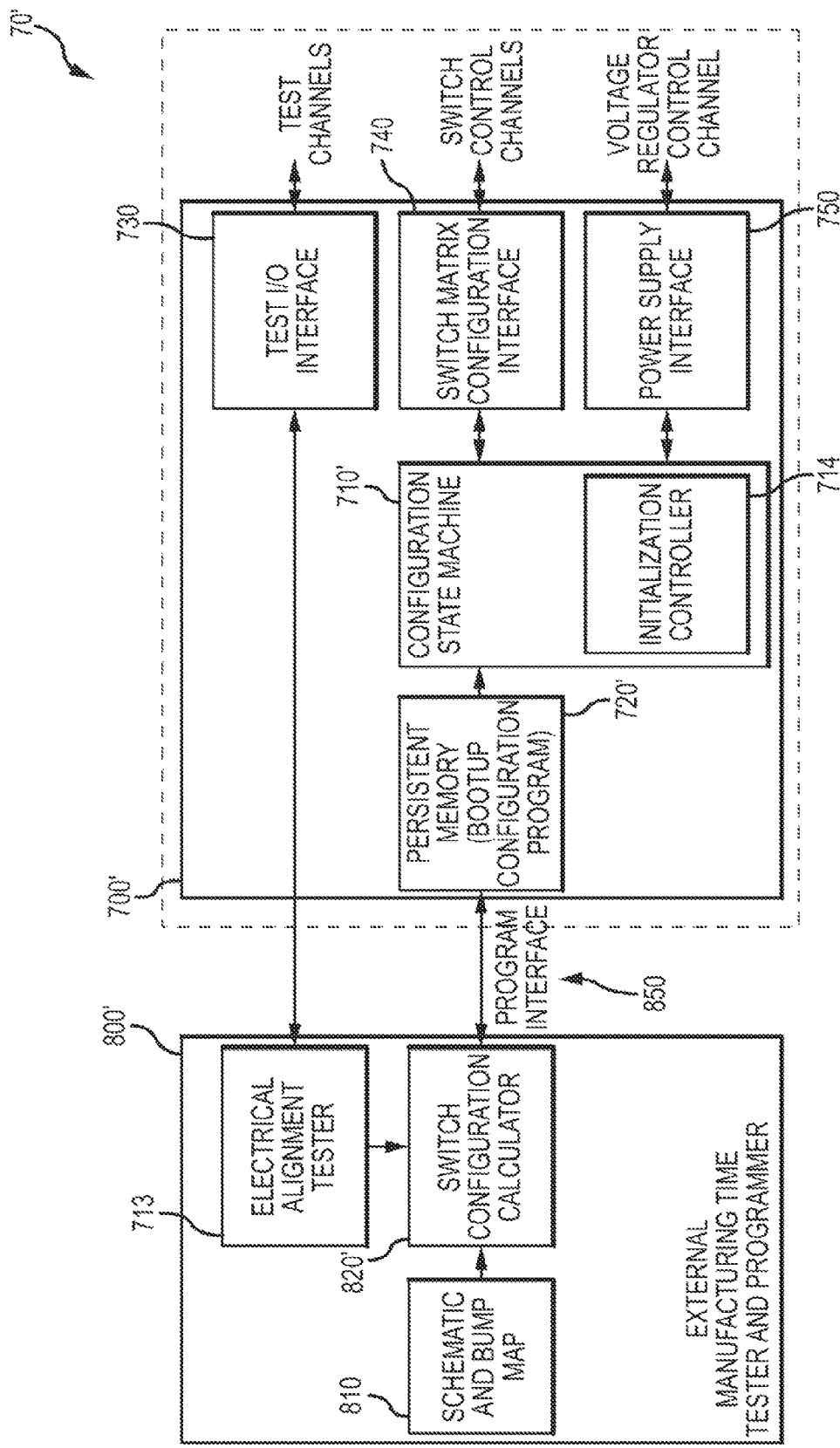
FIG. 15 is a block diagram of a system including a test and configuration block according to some examples of the present disclosure.

FIGS. 14 and 15 show block diagrams of systems including a test and configuration blocks according to the present disclosure. System 70, 70' includes test and configuration block 700, 700'. Test and configuration block 700, 700' comprises a configuration state machine 710, 710', which includes an initialization controller block 714. The initialization controller block 714 may be configured to perform functions associated with boot-up and power sequence for the system. Test and configuration block 710, 710' further comprises one or more memory units. For example, test and configuration block 710, 710' may include non-volatile persistent memory 720, 720'. Memory 720, 720' may be programmed at manufacturing time through an external tester and programmer 800, 800', which uses schematic connectivity and die bump map 810 to calculate switch configuration 820 for programming cross bar switches 122 of base chip 100.

The configuration state machine 710, 710' may be configured to drive control channels to control voltage regulators, test channels, and switch configuration channels. System 70, 70' may also include test I/O interface 730 which is configured for pushing and pulling test vectors to and from base chip surface bumps. Switch matrix configuration interface 740 loads the switch configuration in the distributed cross bar matrix. Power supply interface 750 is responsible for tuning the voltage regulators on and off for power sequencing.

In the example in FIG. 14, test and configuration block 700 of system 70 includes a runtime volatile memory 722 which may be used to store configuration data (e.g., field programmable configuration and runtime alignment switch configuration data). Configuration state machine 710 of system 700 also includes an alignment controller block 712, which may be configured to perform methods for test and alignment according to the present disclosure (e.g., method 500 and/or 600).

In the example in FIG. 15, system 70' may be configured to use external data to carry out an alignment test. System 70' may be configured to couple to an external tester and programmer 800' which includes an alignment test block 713 configured to perform test and alignment methods according to the present disclosure (e.g., method 500 and/or 600). Persistent memory 720' of the system 70' may be programmed at manufacturing time by the external tester and programmer 800'. The external tester and programmer 800 may combine alignment information with schematic connectivity and die bump map 810 to calculate the switch configuration 820' and provide the switch configuration to system 70' via a program interface 850.

Figure 16:
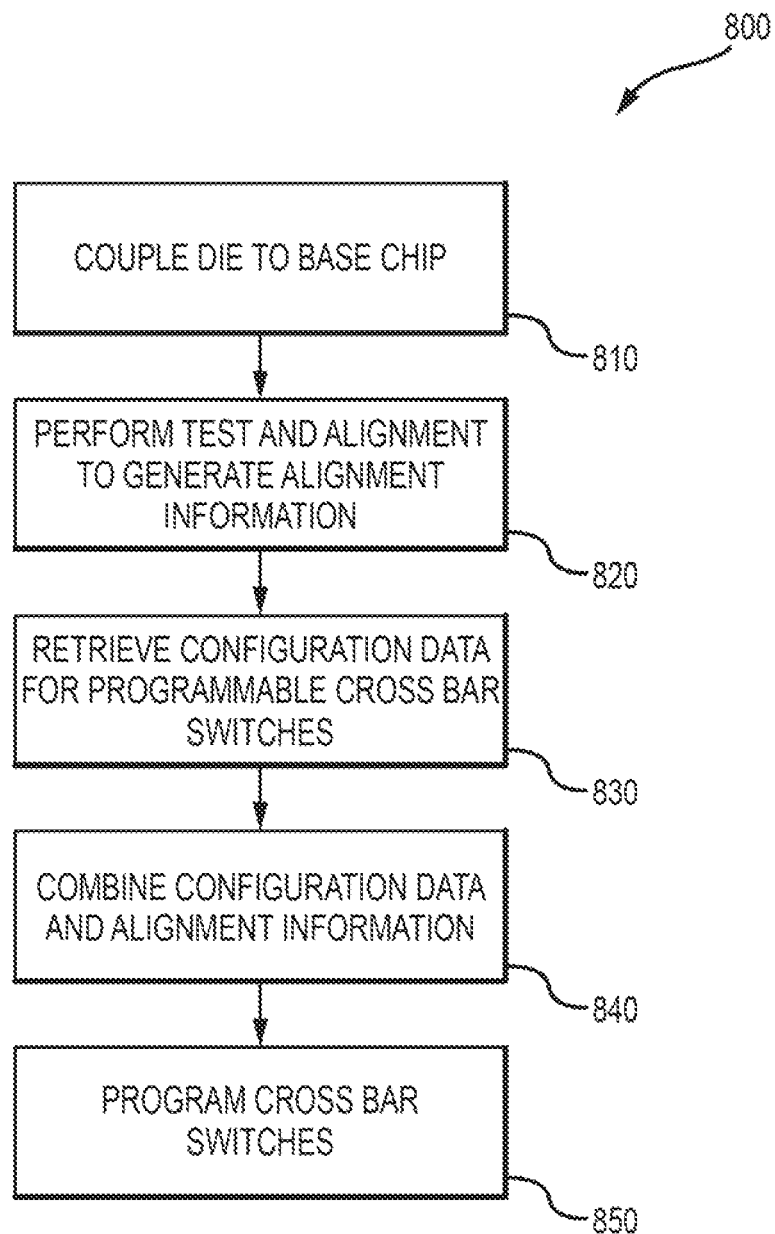
FIG. 16 is a flow diagram of a method for producing a stacked integrated circuit according to the present disclosure.

Methods for producing modular integrated circuits are described. According to some examples, a method 800, as shown in FIG. 16, may include coupling a die to a base chip (box 810), the base chip comprising programmable cross bar switches. The method may further include performing test and alignment to generate alignment information (box 820), including identification of groups of electrically connected metal contacts. The method may further include retrieving configuration data for one or more of the cross bar switches of the base chip (box 830). For example, the base chip may be coupled to an external programmer (e.g., external tester and programmer 800, 800') and the configuration data may be received from the external programmer and loaded onto the base chip, as in the example in FIG. 15. The method may further include combining configuration data with alignment information (box 840) to determine on/off states for individual switches of the cross bar switches. In some examples, a test and configuration block on the base chip is configured to combine the configuration data with the alignment information as in the example in FIG. 14. In further examples, the configuration data and the alignment information are combined by the external programmer and provided to the base chip via a program interface as in the example in FIG. 15. The method may then continue by programing the cross bar switches (box 850) in accordance with the combined configuration data with alignment information.

Figure 17:
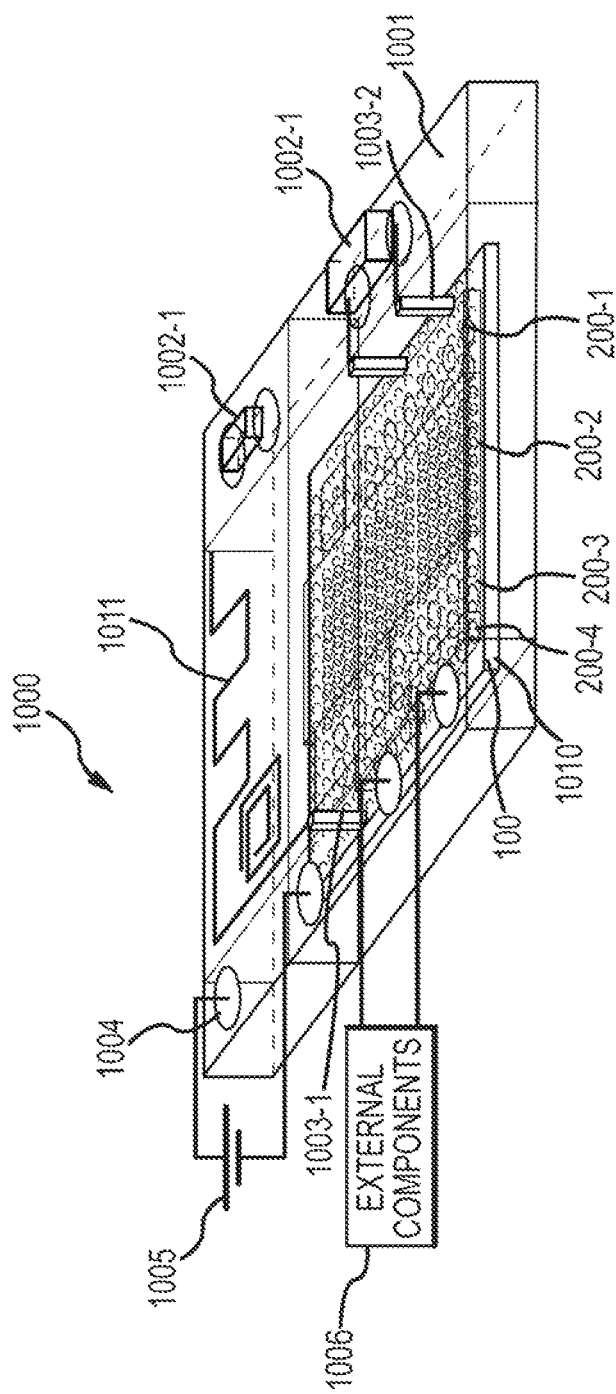
FIG. 17 is a simplified isometric view of an electronic system according to the present disclosure.
Figure 18:
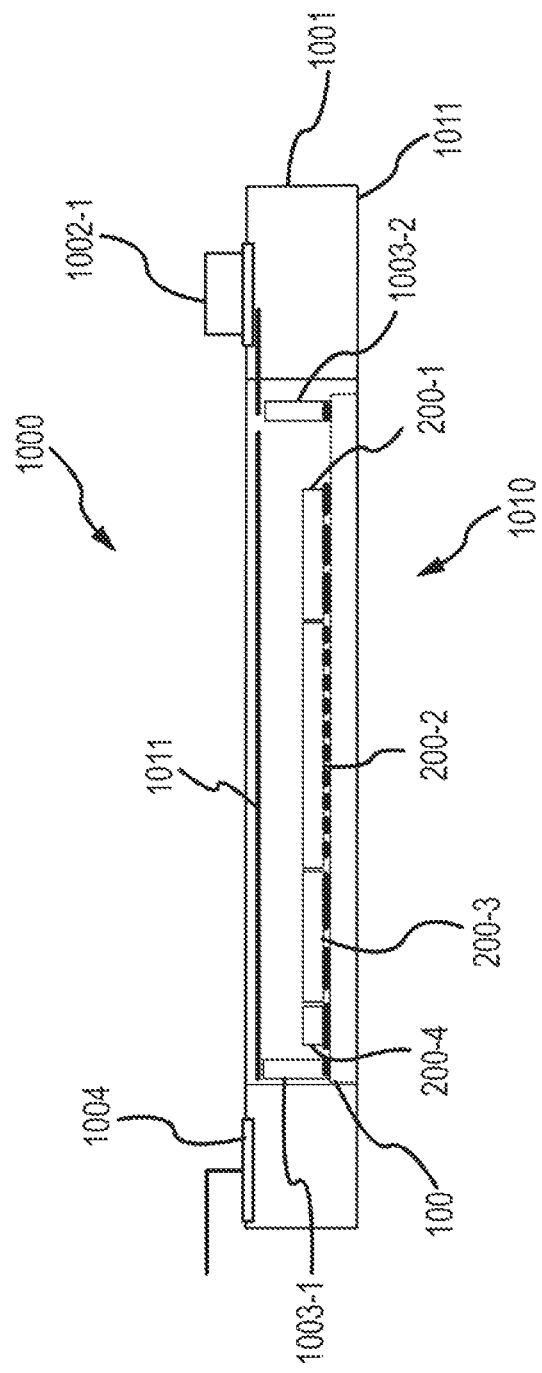
FIG. 18 is a simplified cross section view of the electronic system in FIG. 17.
Figure 19:
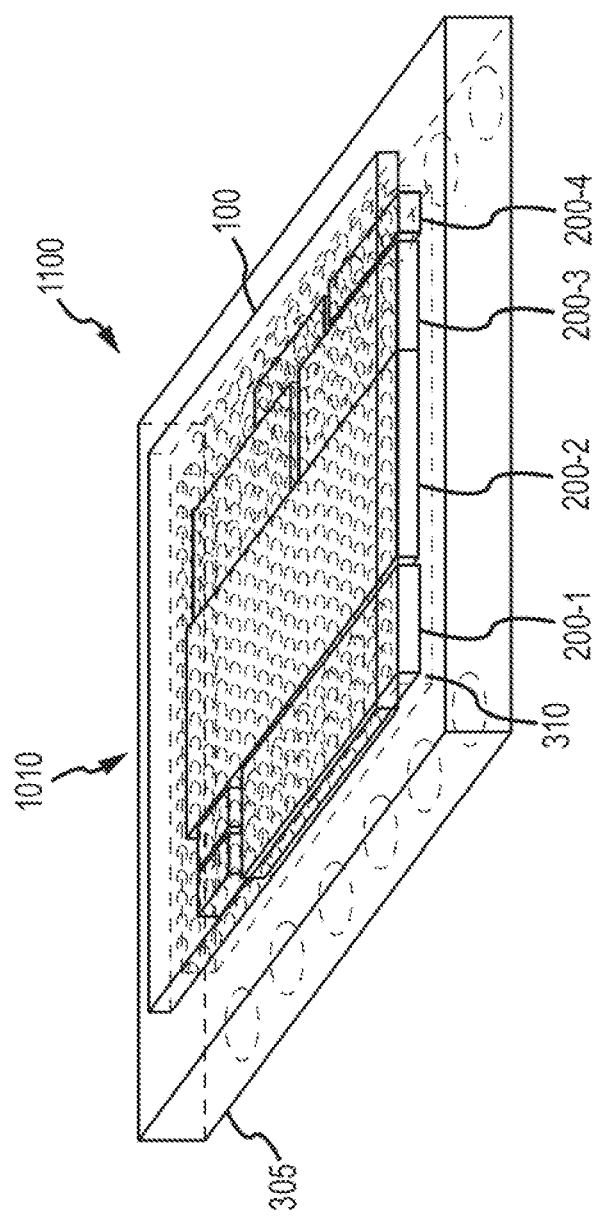
FIG. 19 is a simplified isometric view of an electronic system according to further examples of the present disclosure.

Additional example implementations of electronic systems comprising embedded computing systems according to the present disclosure are described further with reference to FIGS. 17-19.

Example 1

FIGS. 17 and 18 show views of an electronic system comprising a base chip and modular dies according to the present disclosure, which is packaged using a fan out wafer level package. The electronic system 1000 comprises an embedded computing system (also referred to herein as a silicon hybrid 1010) which may include a base chip 100 and attached dies (e.g., dies 200-1, 200-2, 200-3, and 200-4) according to any of the examples herein. For example, silicon hybrid 1010 may comprise the embedded computing system 22 shown in FIG. 2. The silicon hybrid 1010 is packaged within a fan out wafer level package 1001 which may comprise a dielectric material 1011, such as epoxy. The package 1001, provides wiring resources to connect the silicon hybrid 1010 to external and discrete electronic components such as battery 1005, crystal oscillators 1002-1, 1002-2, and external component such as actuators 1006 through metal connection pads 1004. Connections from connection pads 1004 to the silicon hybrid 1010 are made using through mold vias (e.g., vias 1003-1 and 1003-2). Only a few vias are shown to reduce clutter in the drawing. The package may also contain embedded antennas and/or radio frequency components 1011 built in the dielectric material of package 1001. The system 1000 may function as a complete electronic system providing computing and sensing functionality as may be desired, as well as comprising communication capabilities. Electronic systems built according to the examples herein may be very compact.

Examples 2 and 3

Figure 20:
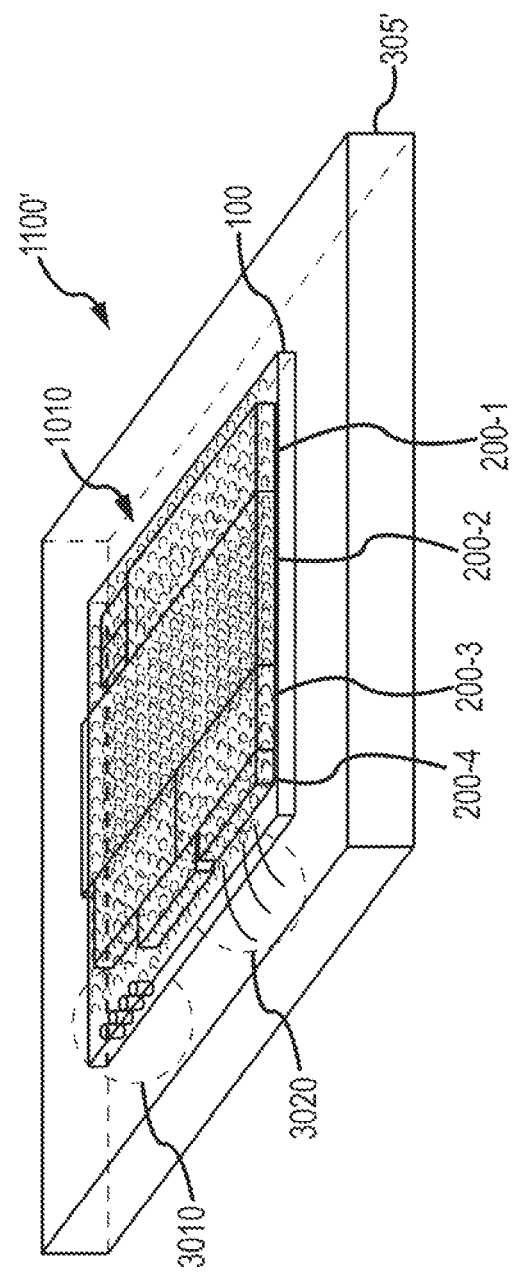
FIG. 20 is a simplified isometric view of an electronic system according to yet further examples of the present disclosure.

FIGS. 19 and 20 show additional examples of electronic system comprising a base chip and modular dies according to the present disclosure, which are packaged using a printed circuit board type package. System 1100 and 1100' include a base chip 100 and dies (e.g., dies 200-1, 200-2, 200-3, and 200-4) according to any of the examples herein.

In that examples in FIGS. 19 and 20, silicon hybrid 1010 comprising base chip 100 and attached dies is further attached to a printed circuit board type package (e.g., board substrate 305, 305') which may then be coupled a mother board or the substrate itself may house further circuitry comprising additional electronic components to form a complete electronic system. In the example in FIG. 19, board substrate 305 may include a cavity 310 and silicon substrate 1010 may be received, at least partially, within the cavity 310. Any known techniques for mounting silicon hybrid 1010 to the package may be used, including surface mount techniques using solder bumps (e.g., as shown in FIG. 19) or using through silicon vias (TSV) 3010 and bond wires 3020 (e.g., as shown in FIG. 20).

As will be appreciated, certain advantages may be obtained by the examples herein. Ultra low/small form factor, reconfigurable, and low power computing systems can be implemented according to examples of the present disclosure, which systems include a programmable layer (e.g., a base chip) that enables pre-fabricated generic dies/chiplets to be assembled into an integrated circuit using multiple electrical interface connections that are uniformly spaced apart. Spatial oversampling (e.g., one-to-many configuration) may be used for the electrical interface connections and routing making the system agnostic to the bump footprint of the dies/chiplets. In addition, the system may be field and factory programmable. Certain common functions that are needed by all dies/chiplets, such as voltage regulators, may be provided on the base chip. Miniaturization as may be obtained according to the examples here may result in lower power losses in the base chip which in turn allows system level power reduction. As will be further appreciated, the same base chip may be used to make an upgraded new system by using new dies/chiplets on a previously used base chip by reprogramming connection boxes of the base chip. Programming of a base chip according to the present disclosure may generally be described as a two-step process including 1) determining which base chip surface bumps are connected to bumps of attached dies, and 2) routing signals according to desired circuit schematic and taking into consideration verified connections between the base chip and dies as determined during the first step. Advantages described herein are illustrative in nature and it will be understood that some embodiments may include some, all or none of the particular advantages described.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A system comprising:
a base chip including:
a plurality of attachment slots for attaching dies thereto;
a plurality of cross bar switches, each of the plurality of cross bar switches associated with respective ones of the plurality of attachment slots, wherein the plurality of cross bar switches are arranged in a matrix configuration, the plurality of cross bar switches comprising a plurality of input/output channels that form a crossed pattern of interconnecting lines between which a connection may be established by closing at least one of the plurality of cross bar switches located at an intersection of at least two of the plurality of input/output channels; and
a test and configuration block configured to receive and transmit test signals for determining electrically connected signal lines of one or more attachment slots when one or more dies are attached to the base chip and further configured to receive configuration data for programming one or more of the cross bar switches.

2. The system of claim 1, wherein the test and configuration block comprises circuitry configured to generate the test signals for determining connectivity between metal contacts of the base chip and metal contacts of a die attached to the base chip.

3. The system of claim 1, wherein the test and configuration block comprises circuitry configured to determine connectivity between metal contacts of the base chip and metal contacts of a die attached to the base chip, the metal contacts of the die having a different size or pitch than a size or pitch of the metal contacts of the base chip.

4. The system of claim 1, wherein the plurality of attachment slots includes a first attachment slot and a second attachment slot, and wherein the first attachment slot comprises a first region on a surface of the base chip and the second attachment slot comprises a second region on the surface of the base chip, the first and second regions including base chip bumps.

5. The system of claim 1, wherein the base chip comprises a plurality of metal contacts associated with each of the attachment slots, the metal contacts comprising pillars, pads, bumps or micro bumps made of conductive material.

6. The system of claim 1, wherein the plurality of attachment slots includes a first attachment slot and a second attachment slot, and wherein the plurality of cross bar switches includes a first plurality of cross bar switches and a second plurality of cross bar switches, the base chip further comprising:
a first connection box which includes the first plurality of cross bar switches and a first memory element configured to store configuration data for programming the first plurality of cross bar switches; and
a second connection box with includes the second plurality of cross bar switches and a second memory element configured to store configuration data for programming the second plurality of cross bar switches.

7. The system of claim 1, wherein at least one of the attachment slots includes a plurality of base chip bumps and wherein the base chip comprises circuitry configured to:
send a test signal to one of the bumps in the plurality of base chip bumps;
receive a response signal from one or more of the remaining bumps in the plurality of base chip bumps in response to the test signal; and
determine a first set of electrically connected bumps by grouping the one or more bumps from which the response signal was received with the one bump to which the test signal was sent.

8. The system of claim 1, wherein at least one of the attachment slots includes a plurality of base chip bumps and wherein the base chip comprises circuitry configured to:
drive one of a pair of adjacent bumps in the plurality of base chip bumps by a voltage signal or a current signal, while one or more neighboring bumps including the other one of the bumps in the pair of adjacent bumps are grounded; and
measure a voltage or current change at the other one of the pair of adjacent bumps to determine a group of electrically connected bumps based on the measured voltage or current change.

9. The system of claim 1, wherein the base chip comprises a plurality of base chip bumps, wherein the system further comprises a die attached to the base chip, the die comprising a plurality of die bumps, and wherein a number, a size, or a pitch of the base chip bumps is the same as a number, a size, or a pitch of the die bumps.

10. The system of claim 1 further comprising a die attached to the base chip, the die comprising a plurality of bumps, wherein the bumps of the die have a same size as bumps of the base chip but the die comprises a fewer number of bumps than the base chip.

11. A system comprising:
a base chip including:
a plurality of attachment slots for attaching dies thereto;
a plurality of cross bar switches, each of the plurality of cross bar switches associated with respective ones of the plurality of attachment slots;
a test and configuration block configured to receive and transmit test signals for determining electrically connected signal lines of one or more attachment slots when one or more dies are attached to the base chip and further configured to receive configuration data for programming one or more of the cross bar switches; and
a plurality of bumps, wherein the base chip is configured to:
determine a first set of electrically connected bumps and a second set of electrically connected bumps;
configure a first plurality of switches of a first cross bar switch such that individual bumps in the first set of electrically connected bumps are routed together; and
configure a second plurality of switches of the first cross bar switch such that individual bumps in the second set of electrically connected bumps are routed together.

12. The system of claim 11 further comprising a first die attached to the base chip at a first attachment slot from the plurality of attachment slots, the first attachment slot comprising the first set of electrically connected bumps, wherein the first set of electrically connected bumps is coupled to a first signal line of the first die and the second set of electrically connected bumps is coupled to a second signal line of the first die.

13. The system of claim 12, wherein the base chip further comprises a second cross bar switch and a second die attached to the base chip at a second attachment slot from the plurality of attachment slots, the base chip further configured to couple signal lines of the first and second dies to input and output channels of the first and second cross bar switches in accordance with the configuration data received in the base chip.

14. The system of claim 12, wherein at least one of the first and second dies includes circuitry for a sensor, an actuator, a memory, a processor, a receiver, a transmitter, or combinations thereof.

15. The system of claim 12, wherein at least one of the first and second dies includes die bumps having at least one of:
   a pitch coarser than a pitch of the bumps of the base chip; and
   a size larger than a size of the bumps of the base chip.

16. A system comprising:
   a base chip including:
      a plurality of attachment slots for attaching dies thereto;
      a plurality of cross bar switches, each of the plurality of cross bar switches associated with respective ones of the plurality of attachment slots;
      a test and configuration block configured to receive and transmit test signals for determining electrically connected signal lines of one or more attachment slots when one or more dies are attached to the base chip and further configured to receive configuration data for programming one or more of the cross bar switches; and
      a plurality of base chip bumps, the base chip further comprising circuitry configured to:
         send a test signal to a first bump of the plurality of base chip bumps;
         receive a return signal from a second bump of the plurality of base chip bumps in response to the test signal; and
         if the return signal is received from the second bump, store location of the second bump for coupling a signal line of the cross bar switch to the stored location.

17. A method of providing a modular integrated circuit, the method comprising:
   coupling a first die to a first attachment slot of a base chip and a second die to a second attachment slot of the base chip, the base chip comprising first and second programmable crossbar switches coupled to respective ones of the first and second attachment slots;
   determining connectivity between a first array of metal contacts of the base chip and first die contacts and between a second array of metal contacts of the base chip and second die contacts to generate alignment data;
   receiving, in respective memory elements of the first and second programmable cross bar switches, configuration data for the first and second programmable cross bar switches; and
   programming signal channels of the first and second programmable crossbar switches based on the received configuration data and generated alignment data.

18. The method of claim 17, wherein the first die contacts comprise a plurality of first die surface bumps and wherein the first array of metal contacts comprises a first array of base chip surface bumps having a pitch finer than a pitch of the first die surface bumps.

19. The method of claim 18, wherein said coupling the first die to the first attachment slot comprises placing the first die onto the base chip such at least one of the first die surface bumps is in physical contact with at least two of the base chip surface bumps from the first array.

20. The method of claim 17, wherein said determining connectivity between the first array of metal contacts of the base chip and the first die contacts comprises determining a first set of electrically connected bumps, comprising:
   sending a test signal to one of the bumps in the first array of base chip surface bumps;
   receiving a return signal from one or more of the remaining bumps in the first array of the base chip surface bumps in response to the test signal; and
   grouping the one or more bumps from which a return signal was received into the first set of electrically connected bumps.

21. The method of claim 20 further comprising determining a second set of electrically connected bumps.

22. The method of claim 21, wherein said programming signal channels of the first programmable cross bar switch comprises routing individual bumps in one of the first and second sets of electrically connected bumps together to a first signal line of the first die and routing individual bumps in the other one of the first and second sets of electrically connected bumps together to a second signal line of the first die.

23. The method of claim 22, wherein said determining connectivity between the first array of metal contacts of the base chip and the first die contacts comprises determining a first set of electrically connected bumps, comprising:
   identifying a pair of adjacent bumps in the first array;
   driving one of the bumps in the pair by a voltage signal or a current signal, while grounding one or more neighboring bumps including the other one of the bumps in the pair; and
   measuring a voltage or current change at the other one of the bumps; and
   grouping the pair of bumps into the first set responsive to a determination of electrical short between the bumps in the pair based on the measured voltage or current change.

24. The method of claim 23 further comprising repeating the driving and measuring steps for remaining pairs of adjacent bumps in the array to determine one or more additional sets of electrically connected bumps.

25. The method of claim 17, wherein the metal contacts of the base chip and the first die contacts comprise base chip surface bumps and first die surface bump, respectively, configured for one-to-one connection between individual ones first die surface bumps and respective ones of the base chip surface bumps.

26. The method of claim 25, wherein said determining connectivity between the first array of metal contacts of the base chip and the first die contacts comprises:
   sending a test signal to a first bump selected from the base chip surface bumps;
   receiving a return signal at a second bump selected from the base chip surface bumps in response to the test signal; and
   designating the second bump as an electrically connected bump in response to receipt of the return signal.

27. The method of claim 17 further comprising:
   decoupling the first die from the first attachment slot;
   coupling a third die to the first attachment slot;
   determining connectivity between the first array of metal contacts and third die contacts to generate new alignment data;
   receiving new configuration data for the first and second programmable cross bar switches; and programming the signal channels of the first and second programmable crossbar switches based on the received new configuration data and generated new alignment data.

* * * * *

UNITED STATES PATENT AND TRADEMARK OFFICE
CERTIFICATE OF CORRECTION

PATENT NO. : 9,842,784 B2
APPLICATION NO. : 15/309163
DATED : December 12, 2017
INVENTOR(S) : Jawad Nasrullah and Ming Zhang Page 1 of 1

It is certified that error appears in the above-identified patent and that said Letters Patent is hereby corrected as shown below:

On the Title Page (73): Assignee should read: Shenzhen Chipuller Chip Technology Co., LTD, Shenzhen, CHINA Signed and Sealed this
Seventh Day of June, 2022

Katherine Kelly Vidal
*Director of the United States Patent and Trademark Office*